US011892525B2

(12) United States Patent
Sabotta et al.

(10) Patent No.: US 11,892,525 B2
(45) Date of Patent: Feb. 6, 2024

(54) MAGNETIC SENSING SYSTEM FOR MULTIPLE DOOR APPLIANCES

(71) Applicant: Littelfuse, Inc., Chicago, IL (US)

(72) Inventors: Todd Sabotta, Chicago, IL (US); Seong-Jae Lee, Chicago, IL (US); Stephen E. Knapp, Chicago, IL (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 17/825,450

(22) Filed: May 26, 2022

(65) Prior Publication Data
US 2023/0127677 A1   Apr. 27, 2023

Related U.S. Application Data

(60) Provisional application No. 63/271,827, filed on Oct. 26, 2021.

(51) Int. Cl.
*G01R 33/09* (2006.01)
*F25D 23/02* (2006.01)
*G01R 33/07* (2006.01)

(52) U.S. Cl.
CPC ......... *G01R 33/091* (2013.01); *F25D 23/028* (2013.01); *G01R 33/072* (2013.01);
(Continued)

(58) Field of Classification Search
CPC .. G01R 33/091; G01R 33/072; G01R 33/093; G01R 33/096; G01R 33/098;
(Continued)

(56) References Cited

U.S. PATENT DOCUMENTS

| | | | |
|---|---|---|---|
| 2008/0314374 A1* | 12/2008 | Bally | F24C 7/08 126/1 R |
| 2009/0229475 A1* | 9/2009 | Bally | F24C 7/08 99/337 |
| 2010/0065546 A1* | 3/2010 | Bally | F24C 15/027 219/390 |

FOREIGN PATENT DOCUMENTS

| | | |
|---|---|---|
| CN | 109387020 A | 2/2019 |
| JP | 2013160421 A | 8/2013 |

(Continued)

OTHER PUBLICATIONS

European Search Report and Written Opinion for European Application No. EP22202230, dated Mar. 22, 2023, 8 pages.

*Primary Examiner* — Alvaro E Fortich
(74) *Attorney, Agent, or Firm* — KDW Firm PLLC

(57) ABSTRACT

A magnetic sensing system includes a sensor and three magnets. The sensor is located within an appliance housing, the appliance having three moving components. The first magnet is disposed in a first orientation adjacent the first moving component, with the position of the first magnet changing in concert with movement of the first moving component. The second magnet is disposed in a second orientation adjacent the second moving component, with the position of the second magnet changing in concert with movement of the second moving component. The third magnet is disposed in a third orientation adjacent the third moving component, with the position of the third magnet changing in concert with movement of the third moving component. The sensor detects displacement of the first moving component, the second moving component, or the third moving component.

11 Claims, 16 Drawing Sheets

(52) U.S. Cl.
CPC ......... *G01R 33/093* (2013.01); *G01R 33/096* (2013.01); *G01R 33/098* (2013.01); *F25D 2700/02* (2013.01)

(58) Field of Classification Search
CPC ............ G01R 33/0088; G01R 33/0206; G01R 33/0005; G01R 33/02; G01R 33/07; F25D 23/028; F25D 2700/02; H03K 17/9515; H03K 17/9517; G01B 7/14
See application file for complete search history.

(56) References Cited

FOREIGN PATENT DOCUMENTS

| | | | | |
|---|---|---|---|---|
| JP | 2021055974 | * | 4/2021 | ............ F25D 23/02 |
| JP | 2021055974 A | | 4/2021 | |

* cited by examiner

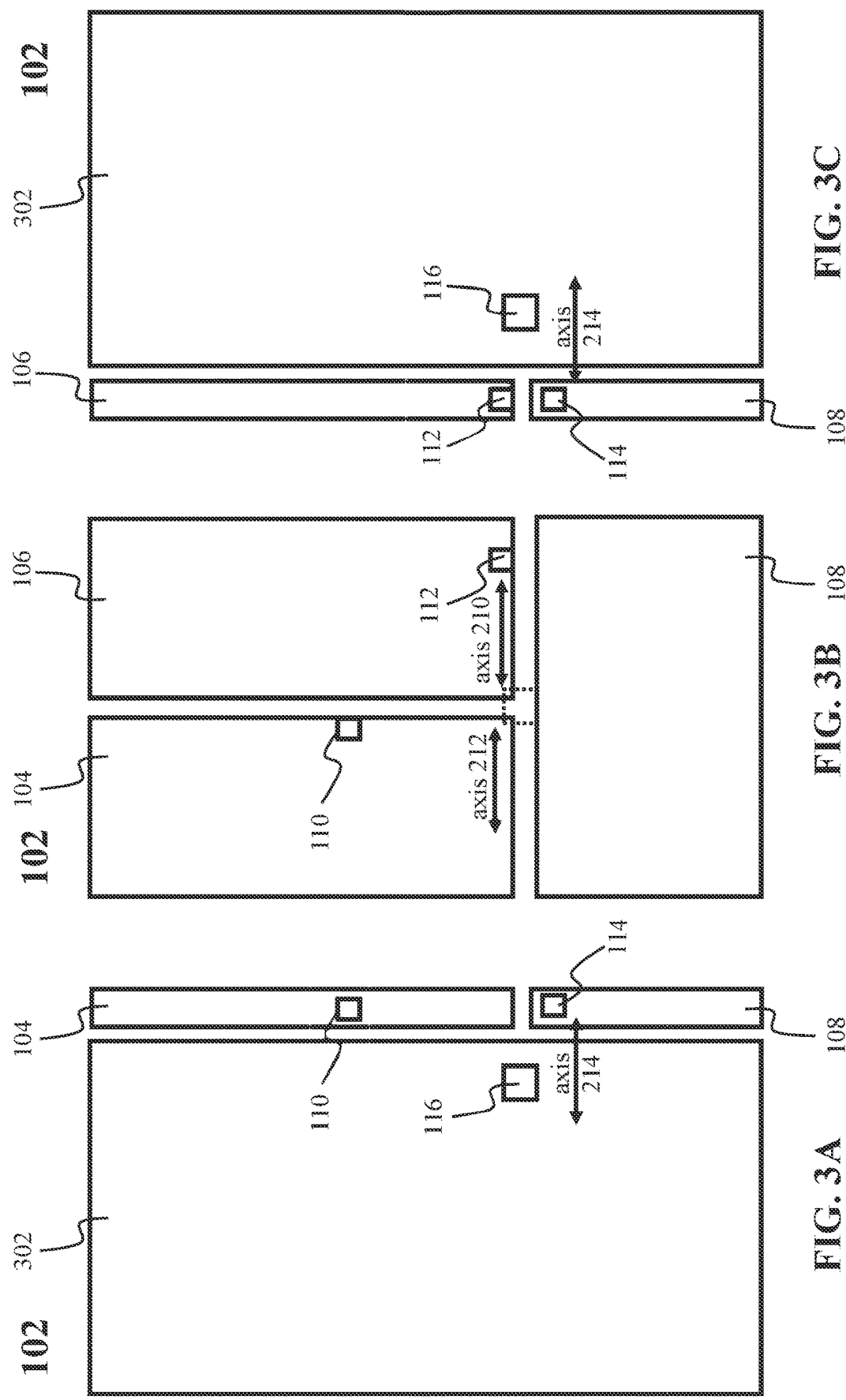

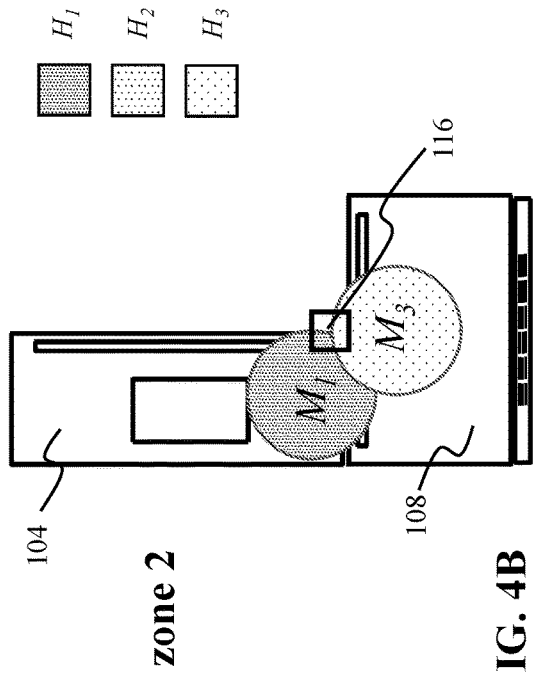
FIG. 4A zone 1
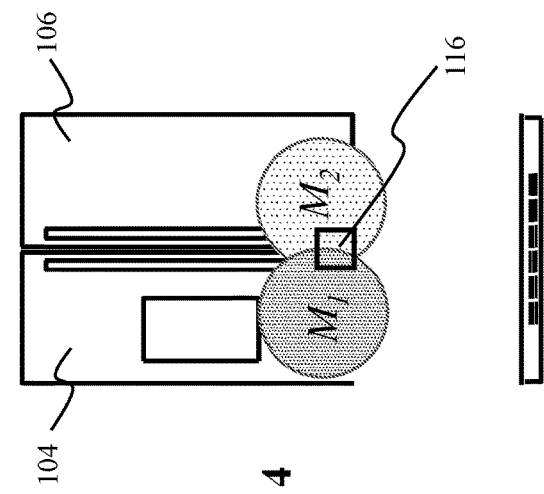
FIG. 4B zone 2
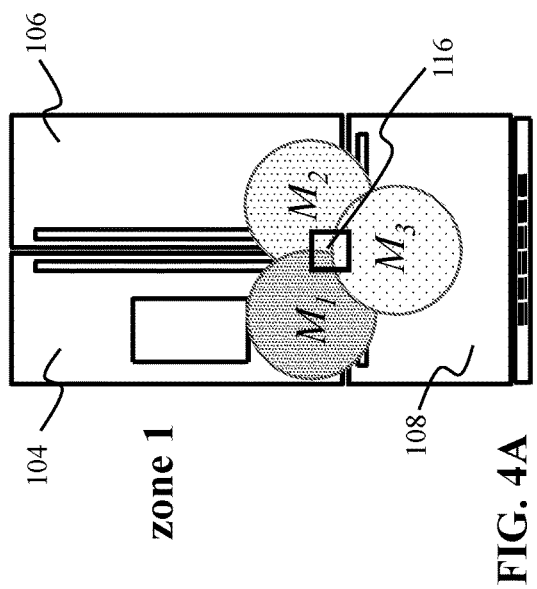
FIG. 4C zone 3
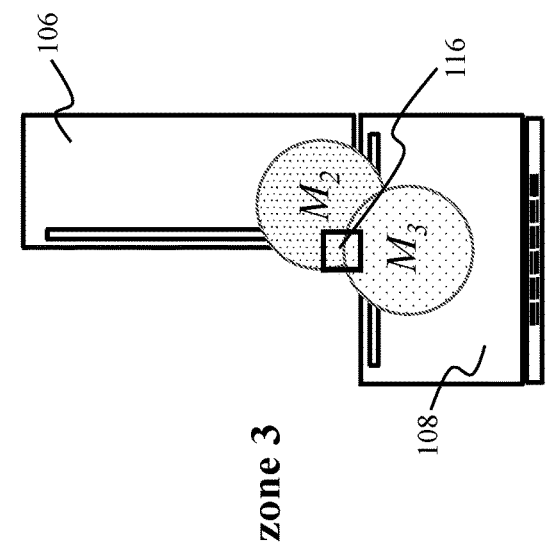
FIG. 4D zone 4

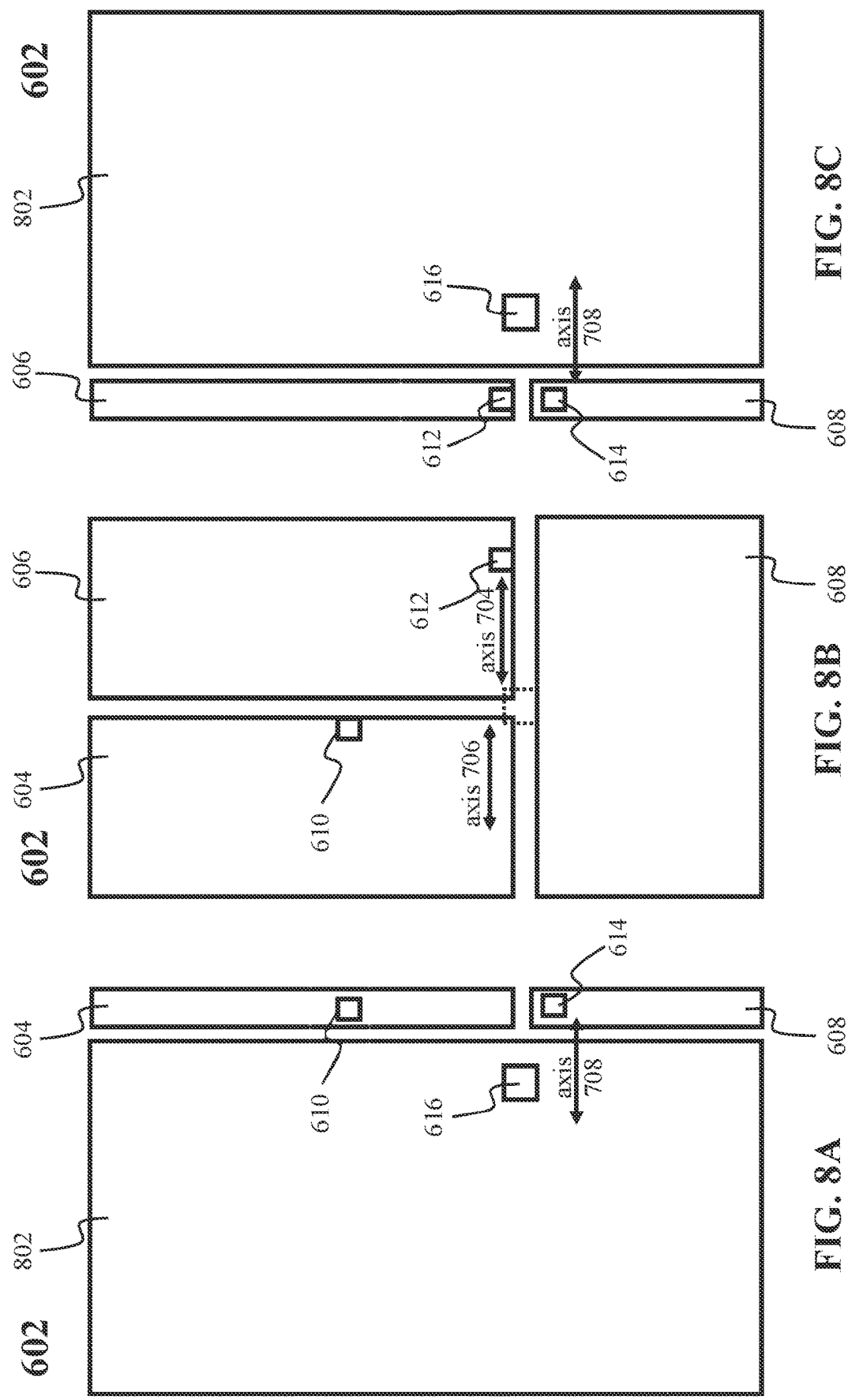

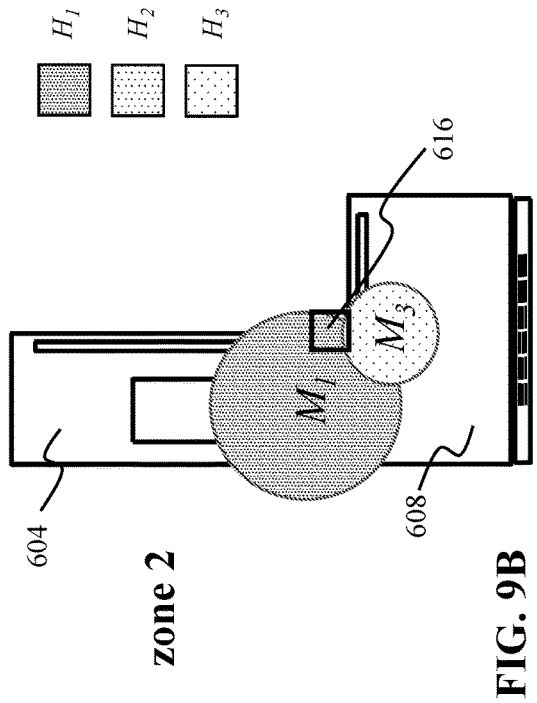
FIG. 9A zone 1
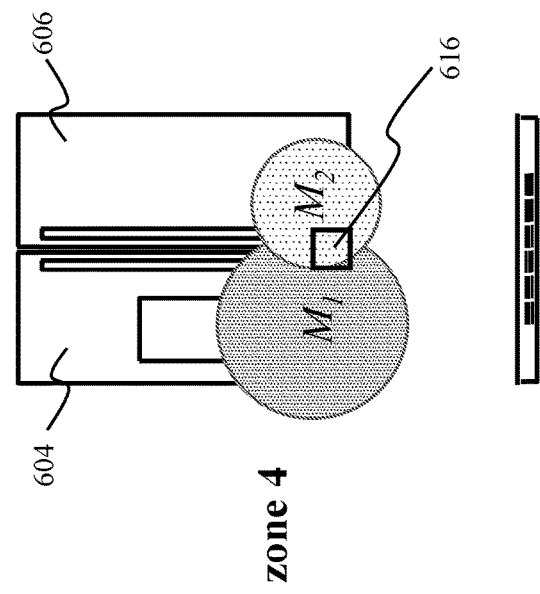
FIG. 9B zone 2
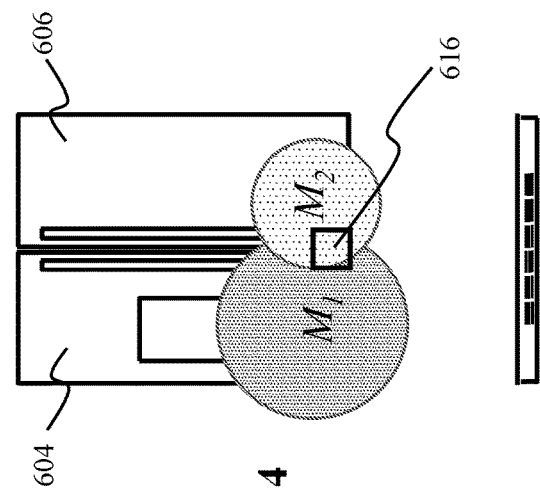
FIG. 9C zone 3
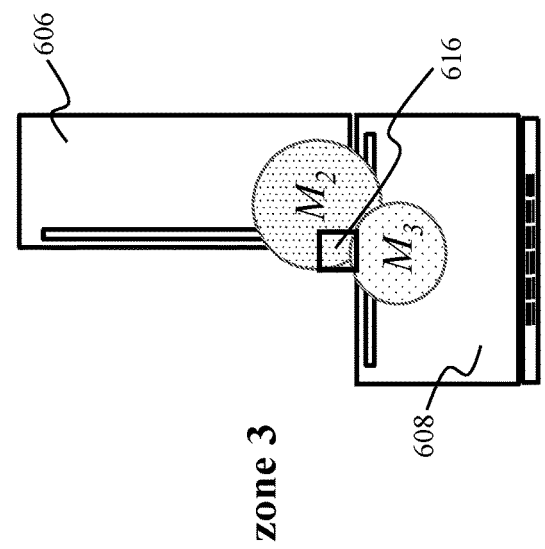
FIG. 9D zone 4

MAGNETIC SENSING SYSTEM FOR MULTIPLE DOOR APPLIANCES

CROSS REFERENCE TO RELATED APPLICATION

This application is a divisional of, and claims the benefit of priority to, U.S. Patent Application No. 63/271,827, filed Oct. 26, 2021, entitled MAGNETIC SENSING SYSTEM FOR MULTIPLE DOOR APPLIANCES," which application is incorporated herein by reference in its entirety.

FIELD OF THE DISCLOSURE

Embodiments of the present disclosure relate to sensors and, more particularly, to sensors that detect a magnetic field.

BACKGROUND

Magnetic sensors are devices that, upon detecting a magnetic field, issue an electrical signal. In contrast to other sensors, magnetic sensors work without making contact with a target and thus last a long time. If sealed, magnetic sensors are immune to dust, water, vibration, and explosive environments, and can thus be used for many applications. There are several types of magnetic sensors, such as Hall effect sensors, tunnel magnetoresistance (TMR) sensors, anisotropic magnetoresistance (AMR) sensors, giant magnetoresistance (GMR) sensors, reed sensors, and so on. Magnetic sensors may also be analog or digital. There are thus many choices for detecting a magnetic field.

Hall effect sensors are semiconductors made up of a thin piece of rectangular p-type or n-type semiconductor material passing a continuous current through itself. TMR sensors consist of a very thin insulating layer sandwiched between two ferromagnetic layers. The Hall effect sensor generates a voltage in the presence of a magnetic field while the TMR sensor changes from a low-resistance material to a high-resistance one.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

An exemplary embodiment of a magnetic sensing system in accordance with the present disclosure may include a sensor, a first magnet, a second magnet, and a third magnet. The sensor is located within an appliance housing, the appliance having first, second, and third moving components. The first magnet is in a first orientation adjacent the first moving component and the position of the first magnet changes in concert with movement of the first moving component. The second magnet is in a second orientation adjacent the second moving component and the position of the second magnet changes in concert with movement of the second moving component. The third magnet is in a third orientation adjacent the third moving component and the position of the third magnet changes in concert with movement of the third moving component. The sensor detects displacement of the first moving component, the second moving component, or the third moving component.

An exemplary embodiment of a magnetic sensing system disposed in an appliance in accordance with the present disclosure may include an analog sensor and three magnets. The analog sensor is centrally located within a housing of the appliance and oriented along a first axis. The first magnet, located within a first door of the appliance, has a first magnetic field strength and is oriented along a second axis in a first position. The second magnet, located within a second door of the appliance, has a second magnetic field strength and is oriented along a third axis in a second position. The third magnet strength, located within a third door of the appliance, has a third magnetic field strength and is oriented along a fourth axis in a third position. The analog sensor detects whether any one of the first door, the second door, and the third door is open.

An exemplary embodiment of a magnetic sensing system in accordance with the present disclosure may include a digital sensor and three magnets. The digital sensor, which includes a first digital integrated circuit (IC), a second digital IC, and a third digital IC, is centrally located within a housing of a refrigerator. The first magnet, near a first door of the refrigerator, moves in concert with movement of the first door and is oriented along a first axis. The second magnet, near a second door of the refrigerator, moves in concert with movement of the second door and is oriented along a second axis. The third magnet, near a third door of the refrigerator, moves in concert with movement of the third door and is oriented along a third axis. The first axis is nearly orthogonal to the second axis and the second axis is nearly orthogonal to the third axis. The digital sensor detects whether any one of the first door, the second door, and the third door is open.

BRIEF DESCRIPTION OF THE DRAWINGS

FIGS. 3A-3C are diagrams illustrating the digital magnetic sensing system of FIGS. 1A-1B, in accordance with exemplary embodiments;

FIGS. 4A-4G are diagrams illustrating a zone arrangement used by the digital magnetic sensing system of FIGS. 1A-1B, in accordance with exemplary embodiments;

FIGS. 8A-8C are diagrams illustrating the analog magnetic sensing system of FIGS. 6A-6B, in accordance with exemplary embodiments;

FIGS. 9A-9G are diagrams illustrating a zone arrangement used by the analog magnetic sensing system of FIGS. 6A-6B, in accordance with exemplary embodiments.

DETAILED DESCRIPTION

For the sake of convenience and clarity, terms such as "top", "bottom", "upper", "lower", "vertical", "horizontal", "lateral", "transverse", "radial", "inner", "outer", "left", and "right" may be used herein to describe the relative placement and orientation of the features and components of the magnetic sensing system, each with respect to the geometry and orientation of other features and components of the magnetic sensing system appearing in the perspective and cross-sectional views provided herein. Said terminology is not intended to be limiting and includes the words specifically mentioned, derivatives therein, and words of similar import.

The embodiments shown and described herein depict a magnetic sensing system as part of a refrigerator. However, the magnetic sensing system may be part of any appliance having movable components that converge to a single location where the movement of each component is to be individually sensed/detected.

Magnetic sensors are devices that issue an electrical signal upon detecting a magnetic field. There are many types of magnetic sensors: some make use of the Hall effect, and some employ magnetoresistance effects, for example. The Hall effect occurs when a magnetic field is applied at right angles to the current flow of an electric field generated in a solid material, with a voltage, known as the Hall voltage, being produced across the solid material. Magnetoresistance is the change in the electrical resistance of a magnetoresistive element when a magnetic field is applied across the element. Hall effect sensors thus produce a voltage in the presence of a magnetic field while magnetoresistive sensors change their resistance.

A Hall sensor consists of a thin piece of rectangular p-type or n-type semiconductor material, such as gallium arsenide (GaAs), indium antimonide (InSb), or indium arsenide (InAs) that passes a continuous current through itself. A magnetoresistive sensor consists of a very thin insulating layer sandwiched between two ferromagnetic layers, where the first ferromagnetic layer has electrons spinning in one direction and the other ferromagnetic layer has electrons spinning in another direction. Magnetoresistive sensors may include tunnel magnetoresistive (TMR), anisotropic magnetoresistive (AMR), giant magnetoresistive (GMR), to name a few. Hall effect sensors and the magnetoresistive sensors may be linear (analog) or digital, bipolar, or unipolar.

Two types of magnetic sensing systems are disclosed herein for detecting movement of movable components of an appliance. A digital magnetic sensing system employs a digital sensor having digital integrated circuits (IC) to detect three similar magnets connected to the components of the appliance. An analog magnetic sensing system employs an analog sensor and the principles of binary weighting to detect magnets connected to the components. Both magnetic sensing systems are illustrated and described below.

Digital Magnetic Sensing System

Figure 1B:
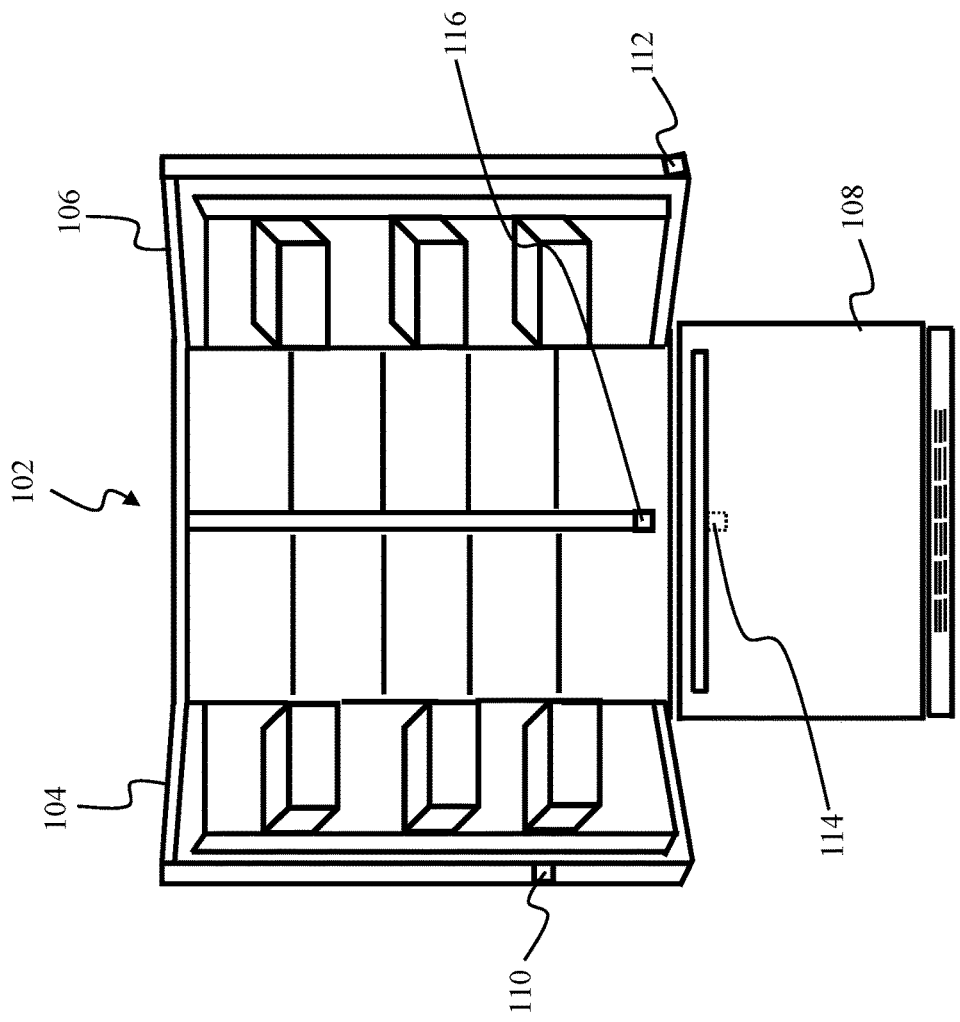
FIGS. 1A-1B are diagrams illustrating an appliance utilizing a digital magnetic sensing system, in accordance with exemplary embodiments.
Figure 1A:
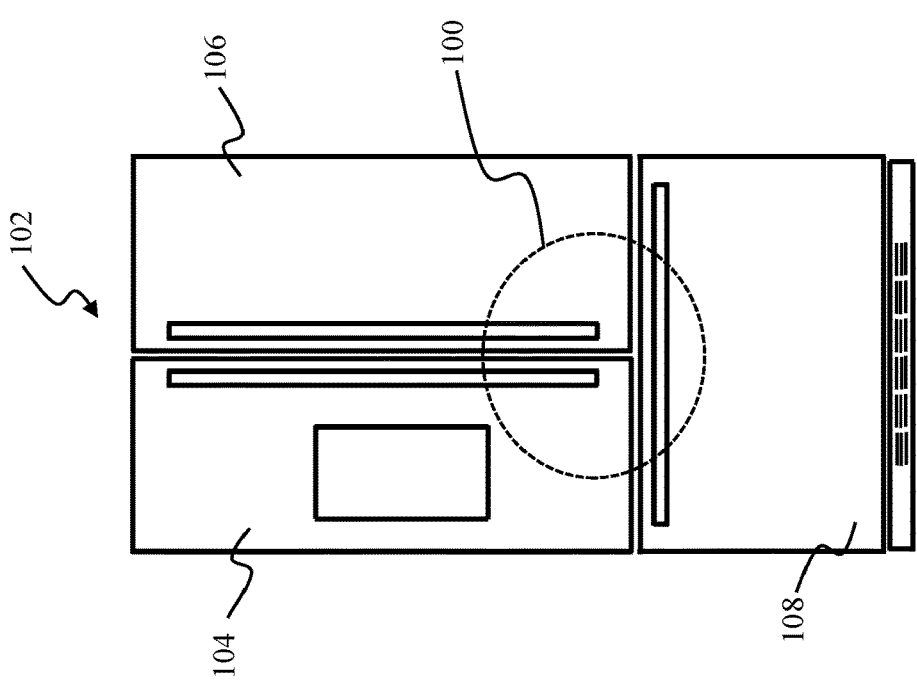

FIGS. 1A and 1B are representative drawings of an appliance utilizing a digital magnetic sensing system 100, according to exemplary embodiments. FIG. 1A shows the appliance with three moving components disposed in a closed configuration; and FIG. 1B shows the appliance with three moving components disposed in an open configuration. In exemplary embodiments, the digital magnetic sensing system 100 employs a digital sensor 116 and three magnets 110, 112, and 114. The appliance is a refrigerator 102 having three moving components: a door 104, a door 106, and a door 108. In exemplary embodiments, the digital sensor 116 is designed to detect displacement of one or more moving components of the appliance.

In exemplary embodiments, the digital magnetic sensing system 100 is centrally located in the refrigerator 102, as indicated with a dotted circle in FIG. 1A, and disposed at an approximate meeting location of the door 104, the door 106, and the door 108. The digital magnetic sensing system 100 features three magnets and a digital sensor: magnet 110 is associated with the door 104; magnet 112 is associated with the door 106; and magnet 114 is associated with the door 108. The digital sensor 116, shown in more detail in FIG. 2A, features three digital integrated circuits (ICs), one dedicated to each magnet. The digital sensor 116 is disposed between the magnet 110, the magnet 112, and the magnet 114. In one embodiment, the digital sensor 116 is centrally positioned in the refrigerator 102, located above the door 108 and disposed between the doors 104 and 106.

In exemplary embodiments, the magnet 110, the magnet 112, and the magnet 114 are disposed so that they are relatively close to the digital sensor 116. The magnet 110 is near the door 104 and may be within the housing of the door, attached to the door, or adjacent to the door; the magnet 112 is near the door 106 and may be within the housing of the door, attached to the door, or adjacent to the door; and the magnet 114 is near the door 108 and may be within the housing of the door, attached to the door, or adjacent to the door. While remaining stationary relative to the door 104, the first magnet 110 is disposed in a first orientation and its position changes in concert with the movement of the door. While remaining stationary relative to the door 106, the second magnet 112 is in a second orientation and its position changes in concert with the movement of the door. While remaining stationary relative to the door 108, the third magnet 114 is disposed in a third orientation and its position changes in concert with the movement of the door. When the doors are closed, all four elements of the digital magnetic sensing system 100 "occupy" the dotted circle indicated in FIG. 1A.

Figure 2B:
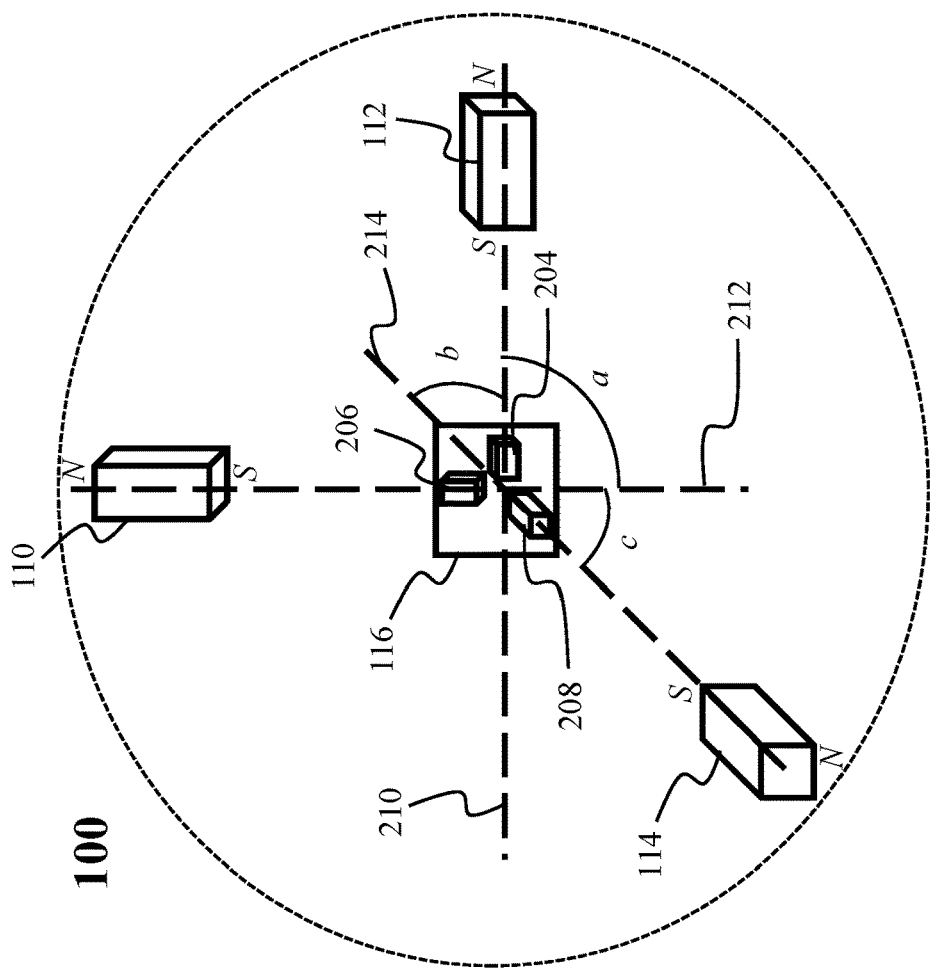
FIGS. 2A-2B are diagrams illustrating a digital sensor and a schematic of the digital magnetic sensing system of FIGS. 1A-1B, in accordance with exemplary embodiments.

In exemplary embodiments, the three magnets 110, 112, and 114 are oriented on three orthogonal axes relative to one another, with the south pole (S) of each magnet being positioned closer to the digital sensor 116 than the north pole (N) of the magnet. In exemplary embodiments, the three magnets 110, 112, and 114 are oriented on three orthogonal (or nearly orthogonal) axes relative to one another and converging on three sensing axes (one for each digital IC), as illustrated in FIG. 2B. This orientation is not meant to be limiting, as the orientation and/or poles of each magnet, as well as its position relative to the digital sensor 116, can be changed.

Although shown external to the door 108 to indicate its position, in exemplary embodiments, the magnet 114 is located inside the door 108 (and thus denoted with dotted lines). The digital sensor 116 appears to be directly above the magnet 114 in FIG. 1B, though the digital sensor is disposed in a chassis behind the doors, in exemplary embodiments, as illustrated in FIGS. 3A-3C, below. The magnet 114 is located in the door 108 of the refrigerator 102 while the digital sensor 116 is located in the chassis of the refrigerator 102. Nonlimiting further options exist for positioning the digital sensor 116 in the central location of the refrigerator 102, such as being snapped into a mullion (e.g., between panes of glass) or inside a liner of one of the compartments of the refrigerator.

In exemplary embodiments, as with components of the refrigerator 102 such as wires, connections, and fixing screws, the components of the digital magnetic sensing system 100 may or may not be visible or accessible to a customer. Thus, the magnet 110, the magnet 112, the magnet 114, and the digital sensor 116 may be located within compartments that are disposed within the housing of the refrigerator 102. Further, although magnet 110, magnet 112, magnet 114, and digital sensor 116 are depicted as rectangular elements of a particular size, the illustrations are merely representative of the relative locations of the components of the digital magnetic sensing system 100 and are not meant to be limiting. In exemplary embodiments, the digital sensor 116 will be able to determine which door 104, 106, or 108 is open based on the magnitude of the magnetic fields generated by magnets 110, 112, and 114.

Figure 2A:
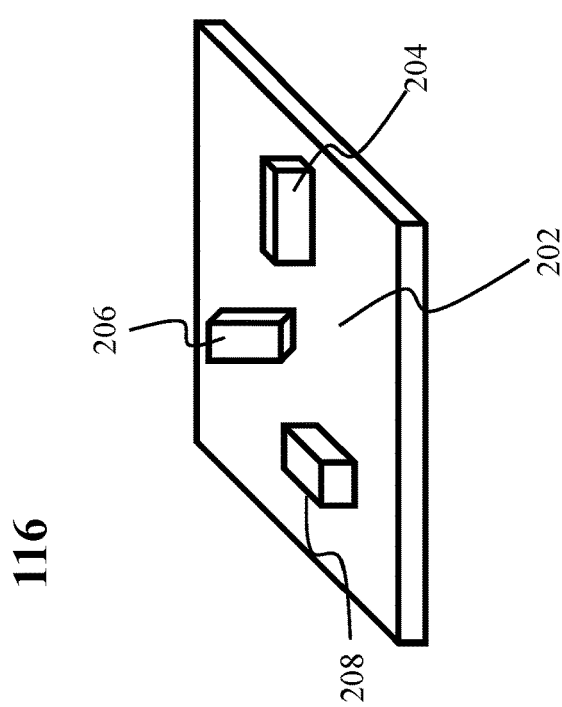

FIGS. 2A and 2B are representative drawings illustrating the digital magnetic sensing system 100 including the digital sensor 116, according to exemplary embodiments. FIG. 2A is a perspective view of the digital sensor 116; and FIG. 2B is a schematic view of the digital magnetic sensing system 100. The digital sensor 116 features three digital ICs: a digital IC 204 to detect movement of magnet 112; a digital IC 206 to detect movement of magnet 110; and a digital IC 208 to detect movement of magnet 114. The digital ICs 204, 206, and 208 are disposed on a printed circuit board 202. Other components of the digital sensor 116 are omitted for simplicity of illustration.

In exemplary embodiments, the three magnets 110, 112, and 114 are oriented on three orthogonal (or nearly orthogonal) axes relative to one another and converging on three sensing axes (one for each digital IC), indicated as axes 210, 212, and 214. The magnet 112 and the digital IC 204 are oriented on the axis 210; the magnet 110 and digital IC 206 are oriented on the axis 212; and the magnet 114 and digital IC 208 are oriented on the axis 214. The south pole (S) and north pole (N) designations of each magnet are indicated, with the S side of each magnet facing toward the digital sensor 116. Where the magnets 110, 112, and 114 are orthogonal to one another, the axis 210 may be thought of as the x axis, the axis 212 may be thought of as the y axis, and the axis 214 may be thought of as the z axis.

However, in some embodiments, the digital magnetic sensing system 100 works without the magnets 110, 112, and 114 being strictly orthogonal to one another. Angles a, b, and c indicate the relative angles between axes, with a indicating the angle between the axis 210 and the axis 212, angle b indicating the angle between the axis 210 and the axis 214, and angle c indicating the angle between the axis 212 and the axis 214. In exemplary embodiments, a=b=c=90° such that the three magnets 110, 112, and 114 are orthogonal to one another. In some embodiments, the digital magnetic sensing system 100 also works when a≠b≠c. In other words, the digital magnetic sensing system 100 can detect movement of magnets 110, 112, and 114 when a=93°, b=87°, and c=90°, as one example. In exemplary embodiments, the digital magnetic sensing system 100 is able to detect movement of magnets 110, 112, and 114 when a=90°±19°, b=90°±19°, and c=90°±19°, preferably when a=90°±5°, b=90°±5°, and c=90°±5°, and more preferably when a=90°±3° b=90°±3°, and c=90°±3°. In exemplary embodiments, when a=90°±5°, b=90°±5°, and c=90°±5°, the magnets are said to be nearly orthogonal to one another.

FIGS. 3A-3C are representative views of the refrigerator 102 of FIGS. 1A and 1B, according to exemplary embodiments. FIG. 3A shows a left side view; FIG. 3B shows a front view; and FIG. 3C shows a right-side view. FIGS. 3A and 3C include a chassis 302 to illustrate the depth of the refrigerator 102 not visible in FIGS. 1A and 1B. As in the preceding drawings, the magnet 110, the magnet 112, the magnet 114, and the digital sensor 116 are shown.

In exemplary embodiments, the digital sensor 116 is positioned in the chassis 302 of the refrigerator 102. In alternative embodiments, the digital sensor 116 may be placed between planes of glass or in a liner of one of the compartments of the refrigerator 102. FIGS. 3A and 3C show the magnet 114 disposed within the door 108. The illustrations further show that the position of the digital sensor 116 is approximately along the axis 214 relative to the magnet 114. This ensures that the digital IC 208 that will be sensing the magnet 114, as well as the magnet 114, are disposed along the axis 214.

In FIG. 3B, the digital sensor 116 is shown as a dotted line, to indicate its position "behind" the doors. In FIGS. 3B and 3C, the magnet 112 is disposed along a bottom portion of the door 106 distal to the digital sensor 116. The position of the digital sensor 116 is approximately along the axis 210 relative to the magnet 112. This ensures that the digital IC 204 that will be sensing the magnet 112, as well as the magnet 112, are disposed along the axis 210.

The magnet 110 is shown in FIGS. 3A and 3B as being disposed in the door 104. The position of the digital sensor 116 is approximately along the axis 212 relative to the magnet 110. This ensures that the digital IC 206 that will be sensing the magnet 110, as well as the magnet 110, are disposed along the axis 212. Where the axes are orthogonal to one another, the axes 210, 212, and 214 may be thought of as x, y, and z axes.

The positions of the magnets 110, 112, 114, and the digital sensor 116 in the illustrations herein are not meant to be limiting. FIGS. 3A-3C provide an illustration of one configuration of the magnets with the digital sensor 116 that will result in the exemplary orthogonal or near-orthogonal arrangement illustrated in FIG. 2B.

In addition to the magnets 110, 112, and 114 being disposed on distinct axes, the magnets are also characterized as having a direction, given by a vector. Each magnet includes a north pole and a south pole, with N and S shown for each magnet in FIG. 2B. Vectors of each magnet 110, 112, and 114 are oriented from the south pole to the north pole. In addition to vectors which show the magnetic orientation of respective magnets 110, 112, and 114, magnetic field are disposed around each magnet.

In exemplary embodiments, the digital sensor 116 disposed between the three magnets 110, 112, and 114 is designed to detect magnetic field lines. More particularly, the digital IC 204 detects the magnetic field lines of magnet 112; the digital IC 206 detects the magnetic field lines of magnet 110; and the digital IC 208 detects the magnetic field lines of magnet 114.

In exemplary embodiments, by detecting the magnetic field lines for a given magnet (110, 112, or 114), the digital sensor 116 can determine the position of the magnet individually. Magnetic sensor technology, for example, enables detection of the positions of multiple magnets of which magnetization directions are oriented perpendicular to each other, as are the magnets 110, 112, and 114, in one embodiment. The orientation of the magnets 110, 112, and 114 thus enables a magnetic sensor to detect three discrete digital components on different axes.

In exemplary embodiments, the magnetic field strength, H, of each magnet is considered by the digital magnetic sensing system 100. The magnetic field strength for magnet 110 is given by $H_1$; the magnetic field strength for magnet 112 is given by $H_2$; and the magnetic field strength for magnet 114 is given by $H_3$. In some embodiments, the magnetic field strength for the three magnets is identical: $H_1=H_2=H_3$.

In exemplary embodiments, the digital sensor 116 of the digital magnetic sensing system 100 is a Hall sensor. The magnetization directions of the three magnets 110, 112, and 114 are coupled uniquely to respective digital ICs 206, 204, and 208 of the Hall sensor such that each sensing component of the Hall sensor detects the open and closed status of each door. Table 1 shows that there are eight possible combinations of the door positions for the three-door refrigerator 102 of FIGS. 1A and 1B. In exemplary embodiments, because the magnets 110, 112, and 114 are positioned either orthogonally or nearly orthogonally, as described above, the digital sensor 116 can detect the open (O) or close (C) status of each door 104, 106, and 108 independently.

TABLE 1

Possible door positions for three-door refrigerator with digital magnetic sensing system 100

| scenario | door 104 (magnet 110) | door 106 (magnet 112) | door 108 (magnet 114) |
| --- | --- | --- | --- |
| 1 | C | C | C |
| 2 | C | O | C |
| 3 | O | C | C |
| 4 | C | C | O |
| 5 | O | O | C |
| 6 | C | O | O |
| 7 | O | C | O |
| 8 | O | O | O |

It is also possible for the magnetic field strength, H, of all the specifically oriented magnets to be coupled together. In exemplary embodiments, using the individual digital ICs 206, 204, and 208, the digital sensor 116 can individually detect respective magnetic fields to differentiate between the open and closed status of each door of the refrigerator 102. In exemplary embodiments, this is achieved by defining specific zones and determining the door status based on the presence of magnets in the zone. Table 2 features a combination of three magnets for eight zones. The status of each door as opened (O) or closed (C) is determined by the presence of one or more magnets in the zone. Magnet 110 is indicated as $M_1$, magnet 112 is indicated as $M_2$, and magnet 114 is indicated as $M_3$, where M indicates not just the magnetic field strength, given by H, but also the magnetization vector of each magnet.

TABLE 2

Zones defined for door positions of three-door refrigerator with digital magnetic sensing system 100

| zone | magnet | door 104 ($M_1$) | door 106 ($M_2$) | door 108 ($M_3$) |
| --- | --- | --- | --- | --- |
| 1 | $M_1$; $M_2$; $M_3$ | C | C | C |
| 2 | $M_1$; $M_3$ | C | O | C |
| 3 | $M_2$; $M_3$ | O | C | C |
| 4 | $M_1$; $M_2$ | C | C | O |
| 5 | $M_3$ | O | O | C |
| 6 | $M_1$ | C | O | O |
| 7 | $M_2$ | O | C | O |
| 8 | no magnet | O | O | O |

FIGS. 4A-4G are representative drawings showing a zone arrangement utilized by the digital magnetic sensing system 100, according to exemplary embodiments. These illustrations show how the digital magnetic sensing system 100 can determine the status of the three doors based on the distinct zones, according to exemplary embodiments. Because each magnet 110, 112, and 114 of the digital magnetic sensing system 100 does not vary in strength, the circles indicating the relative magnetic field strength of each magnet are the same size. Thus, the magnetic field strength, $H_1$, of magnet $M_1$ is the same as the magnetic field strength, $H_2$, of magnet $M_2$ and the same as the magnetic field strength, $H_3$, of magnet $M_3$. Stated mathematically, $H_1=H_2=H_3$.

In FIG. 4A, a first zone (zone 1) is shown in which all three doors 104, 106, and 108 are closed. Zone 1 consists of three magnetic fields, $M_1$, $M_2$, and $M_3$, with the resultant magnetic fields partially overlapping one another. The digital sensor 116 detects the individual magnetic fields of the first zone, based on information obtained from digital ICs 206, 204, and 208, respectively, with each digital IC detecting its corresponding magnet: digital IC 206 detects magnetic field $M_1$, digital IC 204 detects magnetic field $M_2$, and digital IC 208 detect magnetic field $M_3$. Based on the zone 1 magnetic field, the digital sensor 116 knows that the three doors 104, 106, and 108 are closed.

In FIG. 4B, a second zone (zone 2) is shown in which the door 106 is opened. Zone 2 consists of magnetic fields for magnets $M_1$ and $M_3$, whereas the magnetic field for the $M_2$ magnet (door 106) is outside the sensing area. The individual magnetic fields detected by the digital sensor 116 are based on information obtained from digital ICs 206 and 208, with digital IC 206 detecting magnetic field $M_1$ and digital IC 208 detecting magnetic field $M_3$. In FIG. 4C, a third zone (zone 3) is shown in which the door 104 is opened. Zone 3 consists of magnetic fields for magnets $M_2$ and $M_3$, whereas the magnetic field for the $M_1$ magnet (door 104) is outside the sensing area. The individual magnetic fields detected by the digital sensor 116 are based on information obtained from digital ICs 204 and 208, with digital IC 204 detecting magnetic field $M_2$ and digital IC 208 detecting magnetic field $M_3$.

Figure 4E:
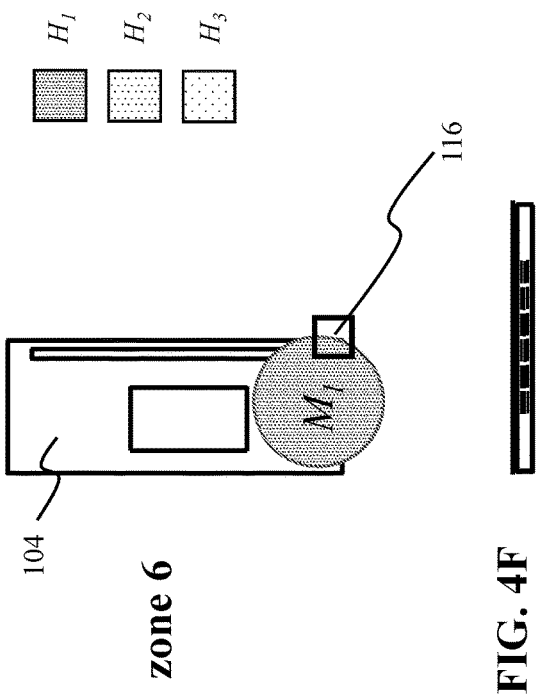

In FIG. 4D, a fourth zone (zone 4) is shown in which the door 108 is opened. Zone 4 consists of magnetic fields for magnets $M_1$ and $M_2$, whereas the magnetic field for the $M_3$ magnet (door 108) is outside the sensing area. The individual magnetic fields detected by the digital sensor 116 are based on information obtained from digital ICs 206 and 204, with digital IC 206 detecting magnetic field $M_1$ and digital IC 204 detecting magnetic field $M_2$. In FIG. 4E, a fifth zone (zone 5) is shown in which the door 104 and the door 106 are opened. Zone 5 consists of the magnetic field for magnet $M_3$, whereas the magnetic field for the $M_1$ magnet (door 104) and the $M_2$ magnet (door 106) are outside the sensing area. The individual magnetic field detected by the digital sensor 116 is based on information obtained from digital IC 208, with digital IC 208 detecting magnetic field $M_3$.

Figure 4F:
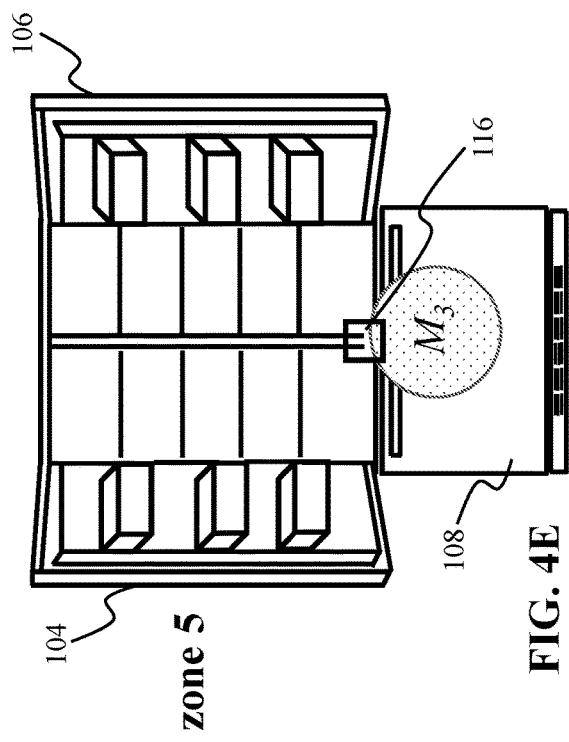
Figure 4G:
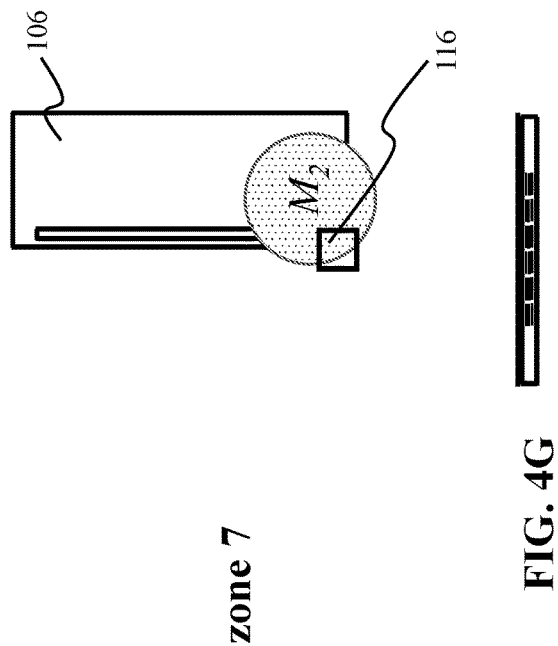

In FIG. 4F, a sixth zone (zone 6) is shown in which the door 106 and the door 108 are opened. Zone 6 consists of the magnetic field for magnet $M_1$, whereas the magnetic field for the $M_2$ magnet (door 106) and the $M_3$ magnet (door 108) are outside the sensing area. The individual magnetic field detected by the digital sensor 116 is based on information obtained from digital IC 206, with digital IC 206 detecting magnetic field $M_1$. In FIG. 4G, a seventh zone (zone 7) is shown in which the door 104 and the door 108 are opened. Zone 7 consists of the magnetic field for magnet $M_2$, whereas the magnetic field for the magnet $M_1$ (door 104) and the magnet $M_3$ (door 108) are outside the sensing area. The individual magnetic field detected by the digital sensor 116 is based on information obtained from digital IC 204, with digital IC 204 detecting magnetic field $M_2$. An eighth zone (zone 8), not depicted in the figures, occurs when there is no magnetic field because the magnetic field for the magnet $M_1$ (the door 104), the magnet $M_2$ (the door 106), and the magnet $M_3$ (the door 108) are all outside the sensing area. There are thus no individual magnetic fields are detected by the digital ICs 206, 204, and 208 of the digital sensor 116 in zone 8.

Figure 5:
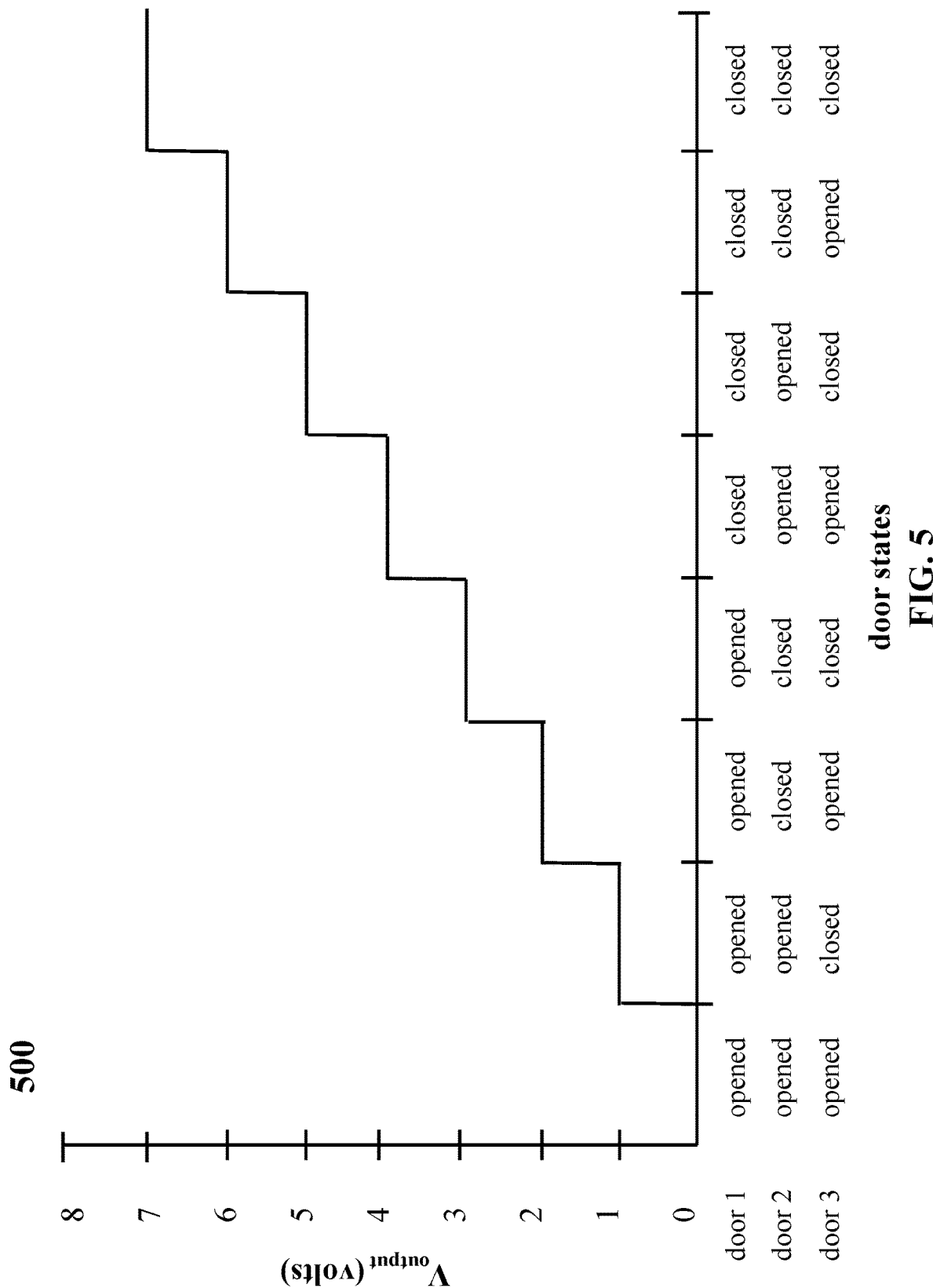
FIG. 5 is a graph illustrating the output supplied by the digital magnetic sensing system of FIGS. 1A-1B, in accordance with exemplary embodiments.

FIG. 5 is a representative graph of voltage output for the digital magnetic sensing system 100, according to exemplary embodiments. The voltage output, $V_{output}$, shown in the y axis of the graph 500 is based on the opened/closed status of the three doors 104, 106, and 108 of the refrigerator 102. In exemplary embodiments, the digital sensor 116 outputs a voltage signal having eight steps based on the combination of doors closed in the refrigerator. Where the voltage is at 0 volts, all three doors 104, 106, and 108 are opened. Where the voltage is 4 volts, the door 104 is closed and the doors 106 and 108 are opened. Where the voltage is 7 volts, all three doors are closed. The staircase output waveform could be converted into a digital format and transmitted on a data bus. Examples include but are not limited to Single Edge Nibble Transmission (SENT), Peripheral Serial Interface version 5 (PSI5), or Pulse-Width Modulated (PWM) formats.

In exemplary embodiments, the three magnets 110, 112, and 114 are neodymium N45 magnets, with the three magnets each measuring 40 mm×10 mm×10 mm. In other embodiments, the three magnets 110, 112, and 114 are a neodymium N35 magnets measuring 20 mm×10 mm×10 mm. In other embodiments, the magnets 110, 112, and 114 are made of ferrite (a ceramic material made by mixing iron oxide with strontium, barium, manganese, nickel, and/or zinc), a combination of aluminum, nickel, and cobalt (Al-NiCo), or samarium cobalt (SmCo).

The dimensions and materials provided herein are not meant to be limiting as the digital magnetic sensing system 100 is operable using a variety of magnet and sensor configurations and materials, such as when used with appliances having different features. For example, the doors 104 and 106 of the refrigerator 102 may not be the same width. Or the door 108 may be disposed at the top of the refrigerator 102 while the doors 104 and 106 are disposed at the bottom. In exemplary embodiments, the digital magnetic sensing system 100 can be adjusted to address different appliance configurations, including the nature and size of the magnets, the positions of the magnets, the location of the digital sensor, the type of digital sensor, and the number of doors.

Analog Magnetic Sensing System

Figure 6B:
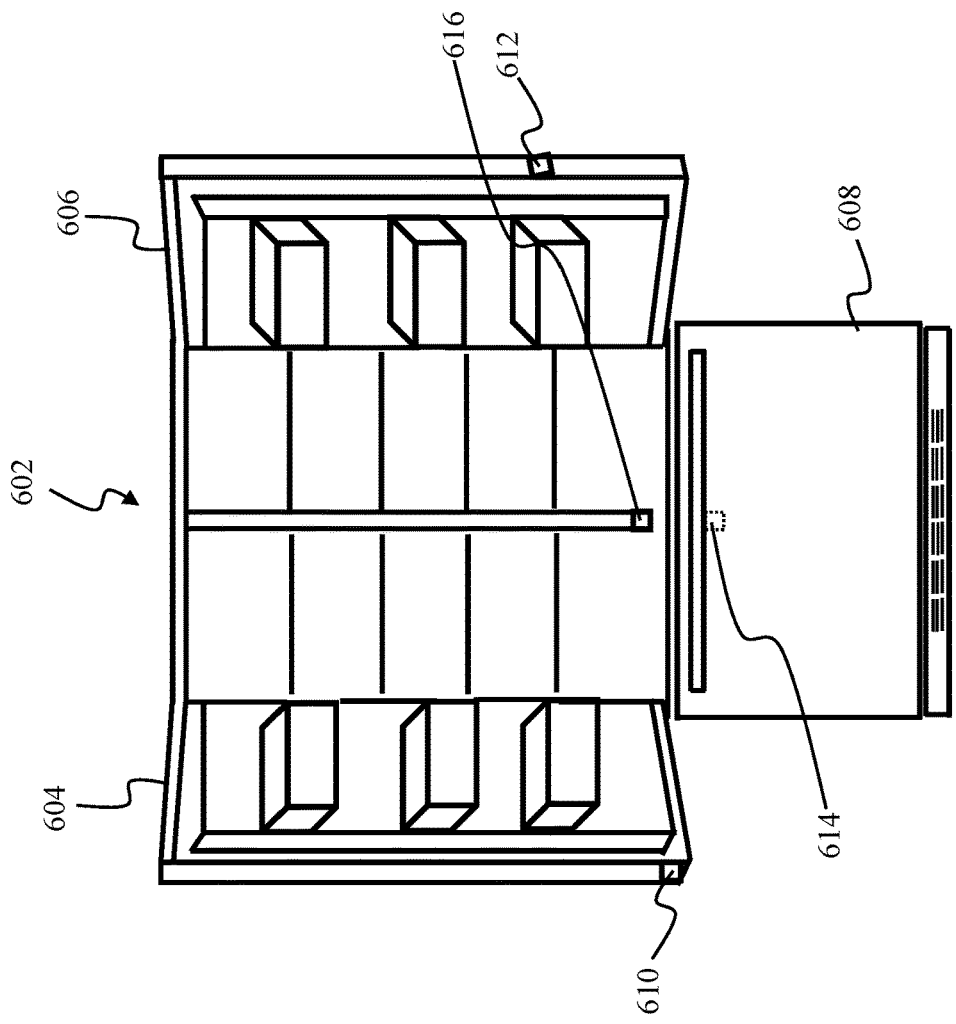
FIGS. 6A-6B are diagrams illustrating an appliance utilizing an analog magnetic sensing system, in accordance with exemplary embodiments.
Figure 6A:
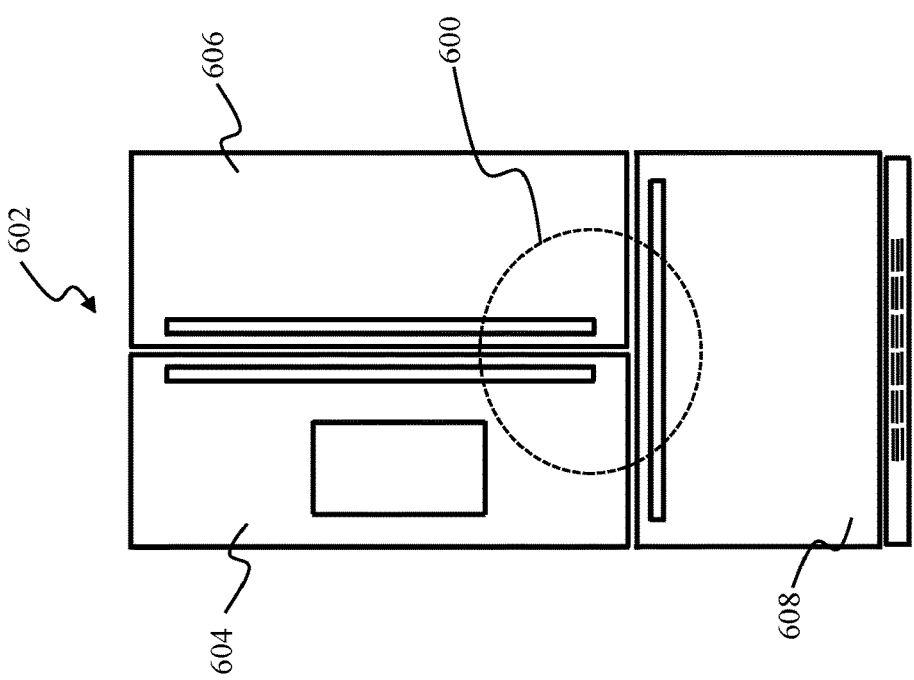

FIGS. 6A and 6B are representative drawings of an appliance utilizing an analog magnetic sensing system 600, according to exemplary embodiments. FIG. 6A shows the appliance with three moving components disposed in a closed configuration; and FIG. 6B shows the appliance with three moving components disposed in an open configuration. In exemplary embodiments, the analog magnetic sensing system 600 employs an analog sensor 616 and three magnets 610, 612, and 614. The appliance is a refrigerator 602 having three moving components: a door 604, a door 606, and a door 608. In exemplary embodiments, the analog sensor 616 is designed to detect displacement of one or more moving components of the appliance.

In exemplary embodiments, the analog magnetic sensing system 600 is centrally located in the refrigerator 602, as indicated with a dotted circle in FIG. 6A, and disposed at an approximate meeting location of the door 604, the door 606, and the door 608. The analog magnetic sensing system 600 features three magnets and an analog sensor: magnet 610 is associated with the door 604; magnet 612 is associated with the door 606; and magnet 614 is associated with the door 608. The analog sensor 616 is disposed between the magnet 610, the magnet 612, and the magnet 614. In one embodiment, the analog sensor 616 is centrally positioned in the refrigerator 602, located above the door 608 and disposed between the doors 604 and 606.

In exemplary embodiments, the magnet 610, the magnet 612, and the magnet 614 are disposed so that they are relatively close to the analog sensor 616. The magnet 610 is near the door 604 and may be within the housing of the door, attached to the door, or adjacent to the door; the magnet 612 is near the door 606 and may be within the housing of the door, attached to the door, or adjacent to the door; and the magnet 614 is near the door 608 and may be within the housing of the door, attached to the door, or adjacent to the door. When the doors are closed, all four elements of the analog magnetic sensing system 600 "occupy" the dotted circle indicated in FIG. 6A.

In exemplary embodiments, the three magnets 610, 612, and 614 are oriented on three orthogonal axes relative to one another, with the south pole (S) of each magnet being positioned closer to the analog sensor 616 than the north pole (N) of the magnet. In exemplary embodiments, the three magnets 610, 612, and 614 are oriented on three orthogonal (or nearly orthogonal) axes relative to one another, with the analog sensor 616 occupying a fourth sensing axis, as illustrated in FIG. 7B. This orientation is not meant to be limiting, as the orientation and/or poles of each magnet, as well as its position relative to the analog sensor 616, can be changed.

Although shown external to the door 608 to indicate its position, in exemplary embodiments, the magnet 614 is located inside the door 608 (and thus denoted with dotted lines). The analog sensor 616 appears to be directly above the magnet 614 in FIG. 6B, though the analog sensor is disposed in a chassis behind the doors, in exemplary embodiments, as illustrated in FIGS. 8A-8C, below. The magnet 614 is located in the door 608 of the refrigerator 602 while the analog sensor 616 is located in the chassis of the refrigerator 602. Nonlimiting further options exist for positioning the analog sensor 616 in the central location of the refrigerator 602, such as being snapped into a mullion or inside a liner of one of the compartments of the refrigerator.

In exemplary embodiments, as with components of the refrigerator 602 such as wires, connections, and fixing screws, the components of the analog magnetic sensing system 600 may or may not be visible or accessible to a customer. Thus, the magnet 610, the magnet 612, the magnet 614, and the analog sensor 616 may be located within compartments that are disposed within the housing of the refrigerator 602. Further, although magnet 610, magnet 612, magnet 614, and analog sensor 616 are depicted as rectangular elements of a particular size, the illustrations are merely representative of the relative locations of the components of the analog magnetic sensing system 600 and are not meant to be limiting. In exemplary embodiments, the analog sensor 616 will be able to determine which door 604, 606, or 608 is open based on the magnitude of the magnetic fields generated by magnets 610, 612, and 614.

FIGS. 7A-7E are representative schematic drawings of the analog magnetic sensing system 600, according to exemplary embodiments. FIGS. 7A-7E each illustrate different characteristics employed by the analog magnetic sensing system 600. Although the illustrations feature four elements, magnet 610, magnet 612, magnet 614, and analog sensor 616, the analog magnetic sensing system 600 may be implemented in different ways, and is thus quite flexible, depending on the application. The magnets 610, 612, and 614 are rectangular cube-shaped, though this is for simplicity of illustration. The magnets may be of a variety of different shapes, whether regular polygons or irregular in shape, and may be made from a single material or a combination of different materials.

Figure 7A:
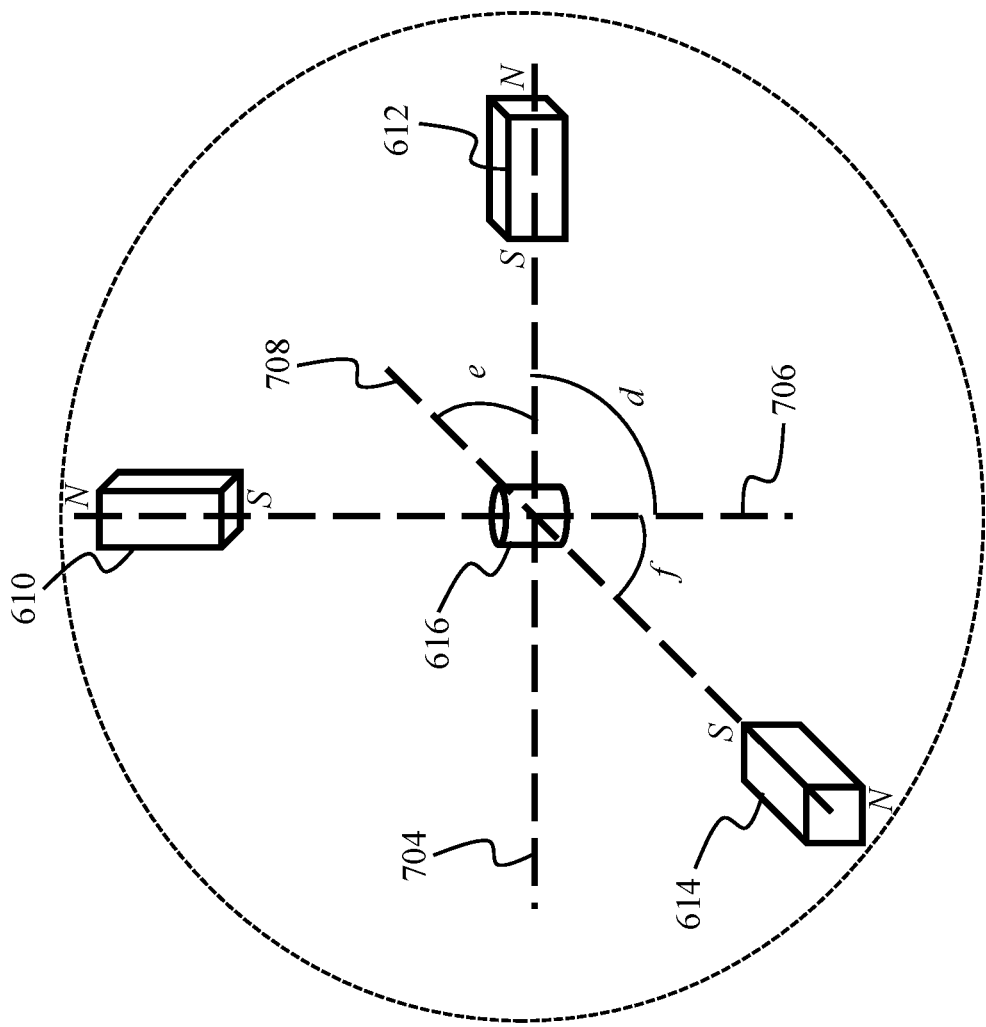
FIGS. 7A-7E are diagrams illustrating characteristics of the analog magnetic sensing system of FIGS. 6A-6B, in accordance with exemplary embodiments.
Figure 7B:
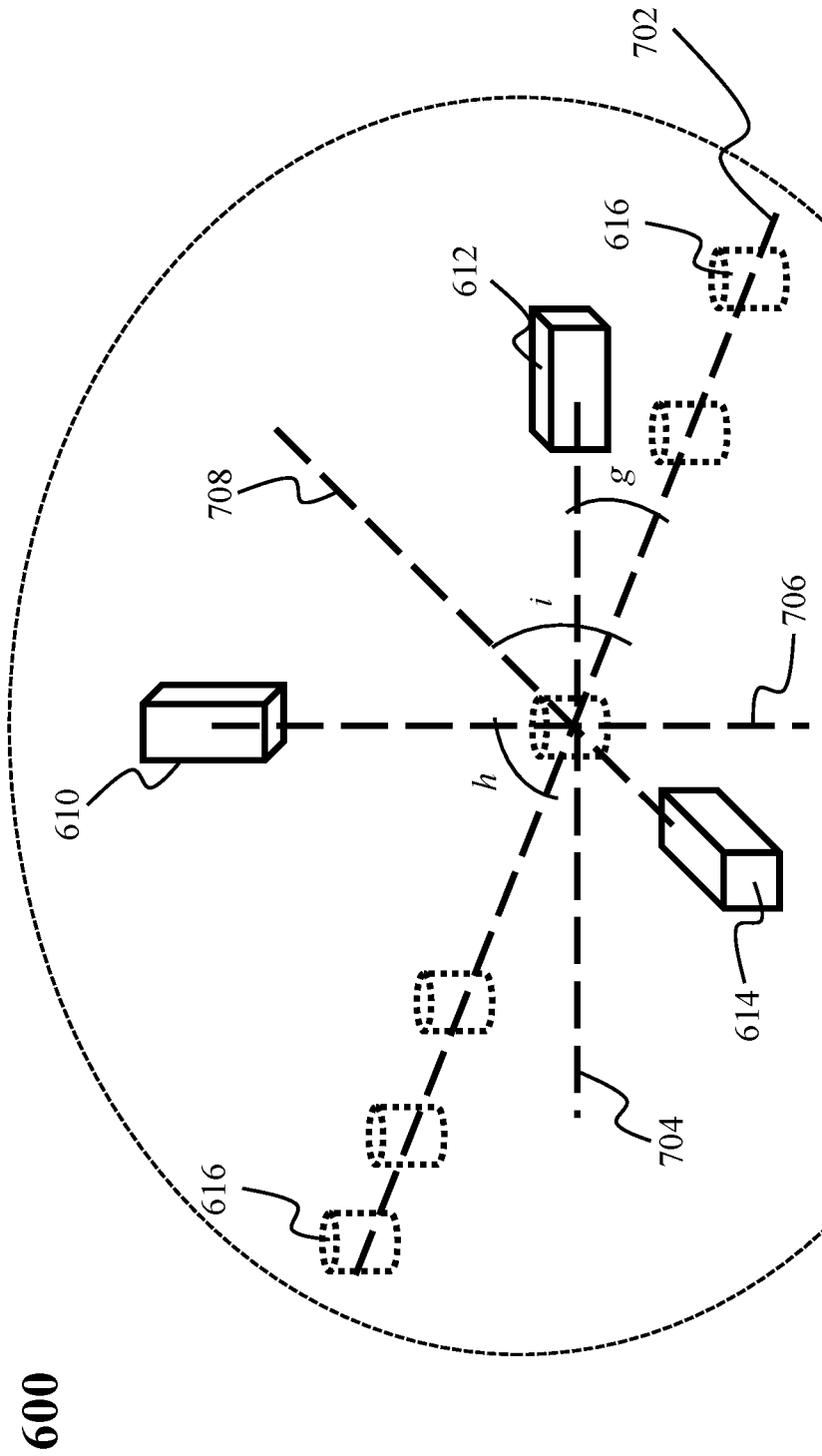

FIG. 7A shows the three magnets 610, 612, and 614 positioned along three different axes 704, 706, and 708. Thus, magnet 610 is disposed along axis 706, magnet 612 is disposed along axis 704, and magnet 614 is disposed along axis 708. The south pole (S) and north pole (N) designations of each magnet are indicated, with the S side of each magnet facing toward the analog sensor 616. Where the magnets 610, 612, and 614 are orthogonal to one another, the axis 704 may be thought of as the x axis, the axis 706 may be thought of as the y axis, and the axis 708 may be thought of as the z axis.

However, in some embodiments, the analog magnetic sensing system 600 works without the magnets 610, 612, and 614 being strictly orthogonal to one another. Angles d, e, and f indicate the relative angles between axes, with d indicating the angle between axis 704 and the axis 706, angle e indicating the angle between the axis 704 and axis 708, and angle f, indicating the angle between the axis 706 and axis 708. In exemplary embodiments, d=e=f=90° such that the three magnets 610, 612, and 614 are orthogonal to one another. In some embodiments, the analog magnetic sensing system 600 also works when d e f. In other words, the analog magnetic sensing system 600 can detect movement of magnets 610, 612, and 614 when d=90°, e=87°, and f=93°, as one example. In exemplary embodiments, the analog magnetic sensing system 600 is able to detect movement of magnets 610, 612, and 614 when d=90°±17°, e=90°±17°, and f=90°±17°, preferably when d=90°±5°, e=90°±5°, and f=90°±5°, and more preferably when d=90°±3°, e=90°±3°, and f=90°±3°. In exemplary embodiments, when d=90°±5°, e=90°±5°, and f=90°±5°, the magnets are said to be nearly orthogonal to one another.

FIG. 7B shows the three magnets 610, 612, and 614 positioned along the axes 704, 706, and 708, as before. Additionally, a fourth axis is shown, known herein as the analog sensing axis 702. The analog sensing axis 702 is the axis on which the analog sensor 616 is disposed. Several instances of the analog sensor 616 are shown as dotted, to indicate that the analog sensor 616 can be located anywhere along the analog sensing axis 702.

In exemplary embodiments, the analog sensing axis 702 intersects the axes 704, 706, and 708. Thus, the analog sensor 616 may be positioned at the intersection point between the axes 704, 706, and 708. However, the analog sensor 616 may be positioned anywhere along the analog sensing axis 702. Angles g, h, and i are also shown. Angle g is the angle between the axis 704 and the analog sensing axis 702; angle h is the angle between the axis 706 and the analog sensing axis; and angle i is the angle between the axis 708 and the analog sensing axis.

In exemplary embodiments, the analog sensing axis 702 may be along the axis 704 (where g=0) or may be g° from the axis 704, where g is non-zero. Similarly, the analog sensing axis 702 may be along the axis 706 (where h=0) or may be h° from the axis 706, where h is non-zero. And the analog sensing axis 702 may be along the axis 708 (where i=0) or may be i° from the axis 708, where i is non-zero.

In exemplary embodiments, the analog magnetic sensing system 600 employs the principle of binary weighting. The binary weighting may be based on the angle between the analog sensor 616 and each of the three magnets or, in other words, the angles between the axis 704, 706, and 708 of magnets 612, 610, and 614 and the analog sensing axis 702, which are given by g, h, and i, respectively. In some embodiments, the angles g, h, and i are selected so that there is a binary weighted coupling factor between the magnets and the analog sensor 616. Thus, as one example, angle g may be selected so that magnet 612 has a coupling factor of 1, angle h may be selected so that magnet 610 has a coupling factor of 2, and angle i may be selected so that magnet 614 has a coupling factor of 4.

Figure 7C:
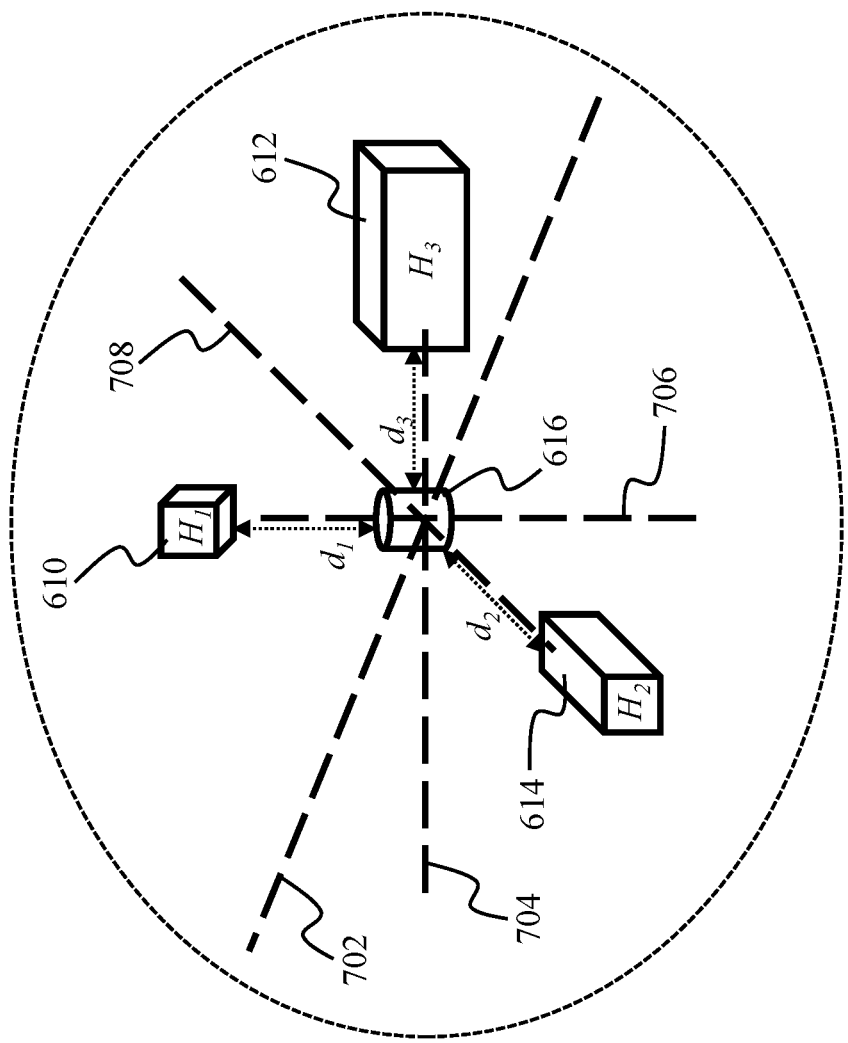

Alternatively, in exemplary embodiments, the three magnets 610, 612, and 614 of the analog magnetic sensing system 600 are selected to be binary weighted. FIG. 7C illustrates this principle. Each magnet 610, 612, and 614 has an associated magnetic field strength: the magnetic field strength for magnet 610 is given by $H_1$; the magnetic field strength for magnet 612 is given by $H_2$; and the magnetic field strength for magnet 614 is given by $H_3$. In exemplary embodiments, the magnetic field strength for the three magnets is binary weighted such that $H_1=2H_2=4H_3$. Thus, for example, the magnet 610 may have a magnetic field strength of 1 Gauss, the magnet 614 may have a magnetic field strength of 2 Gauss, and the magnet 612 may have a magnetic field strength of 4 Gauss. The magnets 610, 612, and 614 are illustrated as having different sizes, which is one way to change their relative magnetic field strengths. Alternatively, each magnet may be made of different material to achieve the binary weighted magnetic field strengths.

In FIG. 7C, distances $d_1$, $d_2$, and $d_3$ are shown, with $d_1$ being the distance between magnet 610 and the analog sensor 616, $d_2$ being the distance between magnet 614 and the analog sensor, and $d_3$ being the distance between magnet 612 and the analog sensor. In exemplary embodiments, the magnets 610, 612, and 614 are binary weighted and the distances between magnets are identical, that is, $d_1=d_2=d_3$, or nearly identical, that is, $d_1 \approx d_2 \approx d_3$.

Figure 7D:
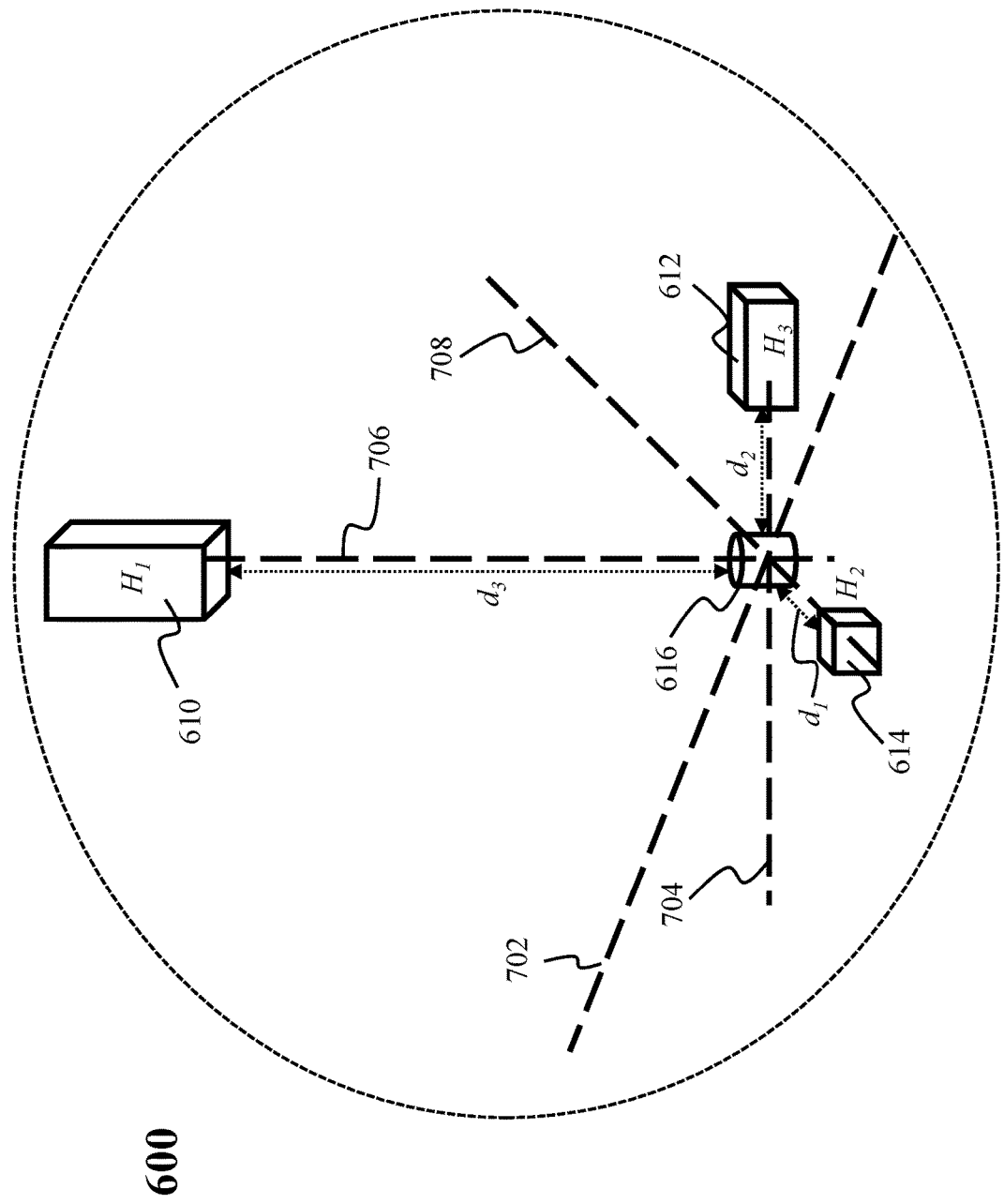

In further embodiments, the analog magnetic sensing system 600 may adjust the distances of the magnets relative to the analog sensor 616 based on the magnetic field strength, H. Thus, in some embodiments, a magnet having a higher magnetic field strength is positioned farther from the analog sensor 616 than a magnet having a lower magnetic field strength. This principle is illustrated in FIG. 7D. Magnet 610 has a magnetic field strength, $H_1$, magnet 614 has a magnetic field strength, $H_2$, and magnet 612 has a magnetic field strength, $H_3$, where $H_1=2\ H_3=4\ H_2$. The distances of the magnets from the analog sensor 616 is thus adjusted based on the magnetic field strength of each magnet. Thus, magnet 614 is a distance $d_1$ from the analog sensor 616 while magnet 612 is a distance $d_2$ from the analog sensor and magnet 610 is a distance $d_3$ from the analog sensor, where the distances $d_1$, $d_2$, and $d_3$ from the analog sensor 616 are adjusted to achieve binary weighting.

Figure 7E:
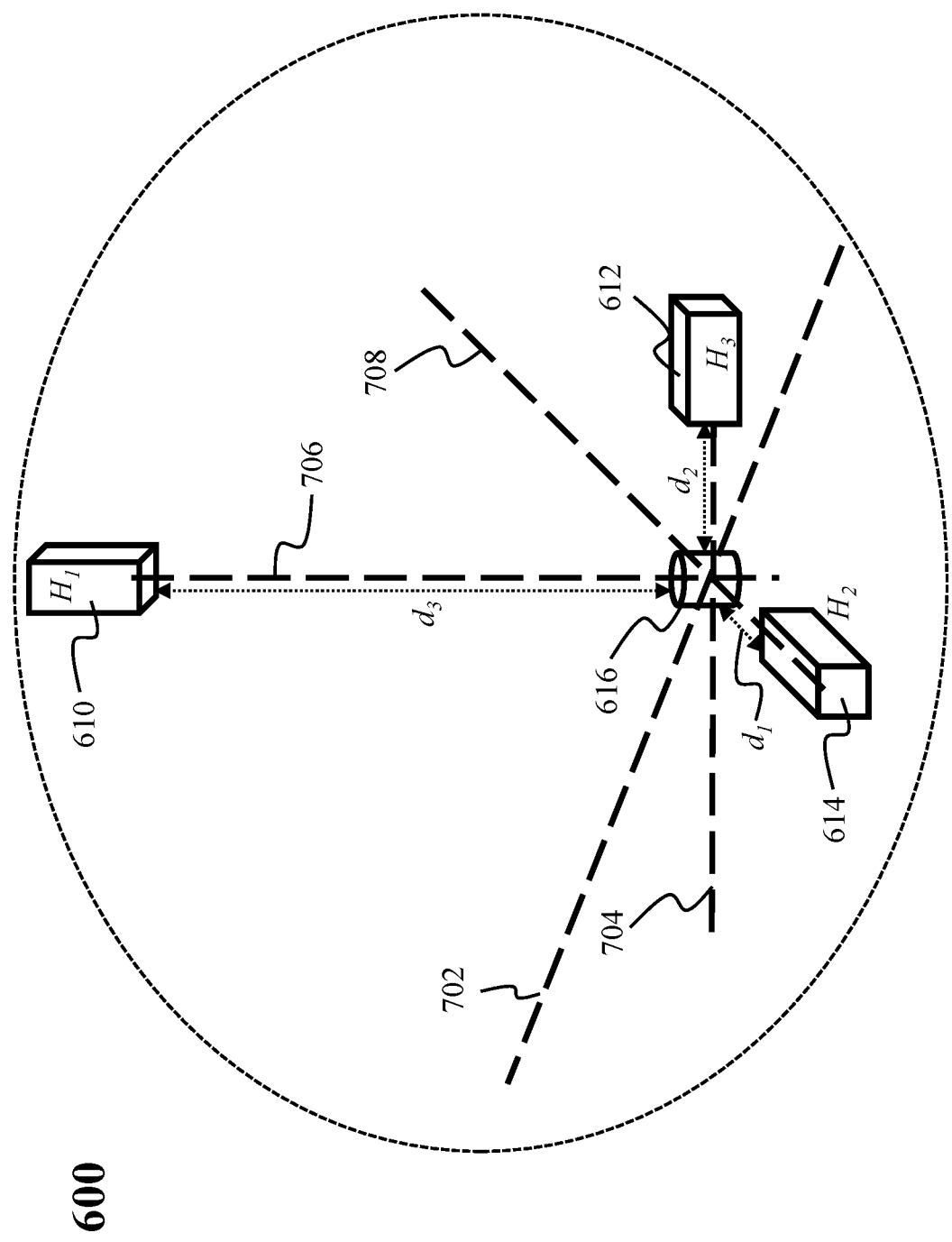

Further, the analog magnetic sensing system 600 may adjust the distances but keep the magnetic field strengths of the magnets the same, as illustrated in FIG. 7E. As in FIG. 7D, the magnet 614 is a distance $d_1$ from the analog sensor 616 while magnet 612 is a distance $d_2$ from the analog sensor and magnet 610 is a distance $d_3$ from the analog sensor, where $d_1$, $d_2$, and $d_3$ are adjusted in such a way to achieve binary weighting. In this case, all three magnets 610, 612, and 614 have the same magnetic field strength, given as $H_1=H_2=H_3$, or nearly the same magnetic field strength, given as $H_1 \simeq H_2 \simeq H_3$.

FIGS. 7A-7E demonstrate that there are different ways to adjust the magnetic strengths, $H_1=H_2=H_3$, the distance, and the angles g, h, and i, between the magnets and the analog sensing axis 702 (FIG. 7B), to achieve the binary weighting that enables the analog sensor 616 to detect the movement of each magnet 610, 612, and 614. In one example, two variables, the magnetic strength and the angles, g, h, and i, are maintained while the third variable, the distances, $d_1$, $d_2$, and $d_3$, between the magnets 610, 612, and 614 and the analog sensor 616, are adjusted to achieve the binary weighting. In another example, the magnetic strengths and the distances are maintained while the angles are changed. In another example, the distances and the angles are maintained while the magnetic strengths are adjusted. In yet another example, two of the three variables are adjusted to achieve the binary weighting. In still another example, all three of the variables are adjusted to achieve the binary weighting. In all these scenarios, the binary weighting enables the analog sensor 616 to detect the movement of the magnets 610, 612, and 614. In exemplary embodiments, the analog magnetic sensing system 600 is thus able to vary the angle between magnet and the analog sensing axis 702, the magnetic field strength of one or more magnets, and distance between each magnet and the analog sensor 616, to enable the analog sensor 616 to sense which door(s) of the appliance are opened.

In exemplary embodiments, the analog magnetic sensing system 600 may adjust the polarity of one or more magnets relative to the analog sensor 616. As one example, the magnet 610 may have its south pole disposed closer to the analog sensor 616 while the magnet 612 and the magnet 614 have their north poles disposed closer to the sensor. Other configurations are possible. The analog magnetic sensor system 600 is flexible in how the polarity of the magnets are positioned relative to the sensor.

FIGS. 8A-8C are representative views of the refrigerator 602 of FIGS. 6A and 6B, according to exemplary embodiments. FIG. 8A shows a left side view; FIG. 8B shows a front view; and FIG. 8C shows a right-side view. FIGS. 8A and 8C include a chassis 802 to illustrate the depth of the refrigerator 602 not visible in FIGS. 6A and 6B. As in the preceding drawings, the magnet 610, the magnet 612, the magnet 614, and the analog sensor 616 are shown.

In exemplary embodiments, the analog sensor 616 is positioned in the chassis 802 of the refrigerator 602. In alternative embodiments, the analog sensor 616 may be placed between planes of glass or in a liner of one of the compartments of the refrigerator 602. FIGS. 8A and 8C show the magnet 614 disposed within the door 608. The illustrations further show that the position of the analog sensor 616 is approximately along the axis 708 relative to the magnet 614.

In FIG. 8B, the analog sensor 616 is shown as a dotted line, to indicate its position "behind" the doors. In FIGS. 8B and 8C, the magnet 612 is disposed along a bottom portion of the door 606 distal to the analog sensor 616. The position of the analog sensor 616 is approximately along the axis 704 relative to the magnet 612. The magnet 610 is shown in FIGS. 8A and 8B as being disposed in the door 604. The position of the analog sensor 616 is approximately along the axis 706 relative to the magnet 610.

The positions of the magnets 610, 612, 614, and the analog sensor 616 in the illustrations herein are not meant to be limiting. FIGS. 8A-8C provide an illustration of one configuration of the magnets with the analog sensor 616 that will result in the exemplary orthogonal or near-orthogonal arrangement illustrated in FIGS. 7A-7E.

Table 3 shows that there are eight possible combinations of the door positions for the three-door refrigerator 602 of FIGS. 6A and 6B. In exemplary embodiments, the analog sensor 616 of the analog magnetic sensing system 600 can identify the opened/closed status of the doors 604, 606, and 608 of the refrigerator 602.

TABLE 3

Possible door positions for three-door refrigerator with analog magnetic sensing system 600

| scenario | door 604 (magnet 610) | door 606 (magnet 612) | door 608 (magnet 614) |
|---|---|---|---|
| 1 | C | C | C |
| 2 | C | O | C |
| 3 | O | C | C |
| 4 | C | C | O |
| 5 | O | O | C |
| 6 | C | O | O |
| 7 | O | C | O |
| 8 | O | O | O |

It is also possible for the magnetic field strength, H, of all the specifically oriented magnets to be coupled together. In exemplary embodiments, the analog sensor 616 can detect the resultant vector field to differentiate between the open and closed status of each door of the refrigerator 602. In exemplary embodiments, this is achieved by defining specific zones and determining the door status based on the presence of magnets in the zone. Table 4 features a combination of three magnets for eight zones. The status of each door as opened (O) or closed (C) is determined by the presence of one or more magnets in the zone. Magnet 610 is indicated as $M_1$, magnet 612 is indicated as $M_2$, and magnet 614 is indicated as $M_3$, where M indicates not just the magnetic field strength, given by H, but also the magnetization vector of each magnet.

TABLE 4

Zones defined for door positions of three-door refrigerator with analog magnetic sensing system 600

| zone | magnet | door 604 ($M_1$) | door 606 ($M_2$) | door 608 ($M_3$) |
|---|---|---|---|---|
| 1 | $M_1 + M_2 + M_3$ | C | C | C |
| 2 | $M_1 + M_3$ | C | O | C |
| 3 | $M_2 + M_3$ | O | C | C |
| 4 | $M_1 + M_2$ | C | C | O |
| 5 | $M_3$ | O | O | C |
| 6 | $M_1$ | C | O | O |
| 7 | $M_2$ | O | C | O |
| 8 | no magnet | O | O | O |

Similarly, the zones defined in Table 4 can be used by the analog magnetic sensing system 600. The status of each door as opened (O) or closed (C) is determined by the presence of one or more magnets in the zone. $M_1$, $M_2$, and $M_3$, indicate not just the magnetic field strength, given by H, but also the magnetization vector of each magnet. As indicated in Table 4, it is the sum of the magnetic fields that is interpreted by the analog sensor 616, rather than the individual magnetic fields interpreted by the digital sensor 116 (using its individual digital ICs).

FIGS. 9A-9G are representative drawings showing a zone arrangement utilized by the analog magnetic sensing system 600, according to exemplary embodiments. These illustrations show how the analog magnetic sensing system 600 can determine the status of the three doors based on the distinct zones, according to exemplary embodiments. Although the above description of FIGS. 7A-7C shows the versatility of the analog magnetic sensing system 600 in terms of magnet size, position, angle, and magnetic field strength, the embodiment of FIGS. 9A-9B assume the magnets are binary weighted, as described above.

As in Table 4, magnet 610 is shown as $M_1$, magnet 612 is given as $M_2$, and magnet 614 is given as $M_3$. Further, circles of varying size are used to indicate the relative magnetic field strength and direction of each magnet. In this example, the magnets are binary weighted so that the magnetic field strength, $H_2$, of magnet $M_2$ is twice the magnetic field strength, $H_3$, of magnet $M_3$ and the magnetic field strength, $H_1$, of magnet $M_1$ is twice the magnetic field strength of magnet $M_2$ (and thus four times the magnetic field strength of magnet $M_3$). Stated mathematically, $H_1=2H_2=4H_3$. In exemplary embodiments, the analog sensor 616 is located along the analog sensing axis 702, and the magnets, $M_1$, $M_2$, and $M_3$ are orthogonal or nearly orthogonal to one another.

Because the magnetic field strength and direction of the three magnets 610, 612, and 614 are specially oriented relative to each other to create a resultant vector field, the analog sensor 616 can differentiate between doors of the refrigerator. Densely dotted bubble denoted $M_1$ s the magnetic field strength of magnet 610; dotted bubble denoted $M_2$ is the magnetic field strength of magnet 612; and sparsely dotted bubble denoted $M_3$ is the magnetic field strength of magnet 614. The analog sensor 616 is shown as a square and is centrally located. In contrast to the digital sensor 116 of the digital magnetic sensing system 100, the analog sensor 616 of the analog magnetic sensing system 600 can determine the opened and closed status of the doors based on a binary weighted response.

In FIG. 9A, a first zone (zone 1) is shown in which all three doors 604, 606, and 608 are closed. Zone 1 consists of three magnetic fields, $M_1$, $M_2$, and $M_3$, with the resultant magnetic fields partially overlapping one another. The analog sensor 616 detects the resultant vector field of the first zone, which consist of a sum of the magnetic fields of $M_1$, $M_2$, and $M_3$, that is, $M_1+M_2+M_3$. Based on the zone 1 magnetic field, the analog sensor 616 knows that the three doors 604, 606, and 608 are closed.

In FIG. 9B, a second zone (zone 2) is shown in which the door 606 is opened. Zone 2 consists of magnetic fields for magnets $M_1$ and $M_3$, whereas the magnetic field for the $M_2$ magnet (door 606) is outside the sensing area. The resultant magnetic field detected by the analog sensor 616 is $M_1+M_3$. In FIG. 9C, a third zone (zone 3) is shown in which the door 604 is opened. Zone 3 consists of magnetic fields for magnets $M_2$ and $M_3$, whereas the magnetic field for the $M_1$ magnet (door 604) is outside the sensing area. The resultant magnetic field detected by the analog sensor 616 is $M_2+M_3$.

Figure 9E:
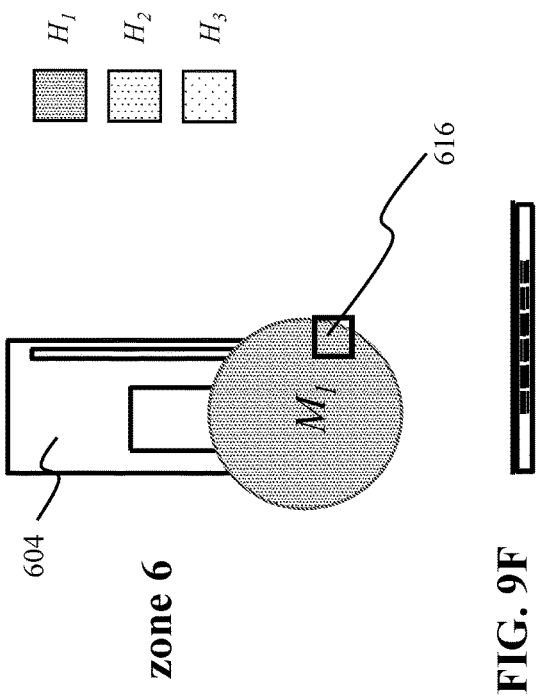

In FIG. 9D, a fourth zone (zone 4) is shown in which the door 608 is opened. Zone 4 consists of magnetic fields for magnets $M_1$ and $M_2$, whereas the magnetic field for the $M_3$ magnet (door 608) is outside the sensing area. The resultant magnetic field detected by the analog sensor 616 is $M_1+M_2$. In FIG. 9E, a fifth zone (zone 5) is shown in which the door 604 and the door 606 are opened. Zone 5 consists of the magnetic field for magnet $M_3$, whereas the magnetic field for the $M_1$ magnet (door 604) and the $M_2$ magnet (door 606) are outside the sensing area. The resultant magnetic field detected by the analog sensor 616 is $M_3$.

Figure 9F:
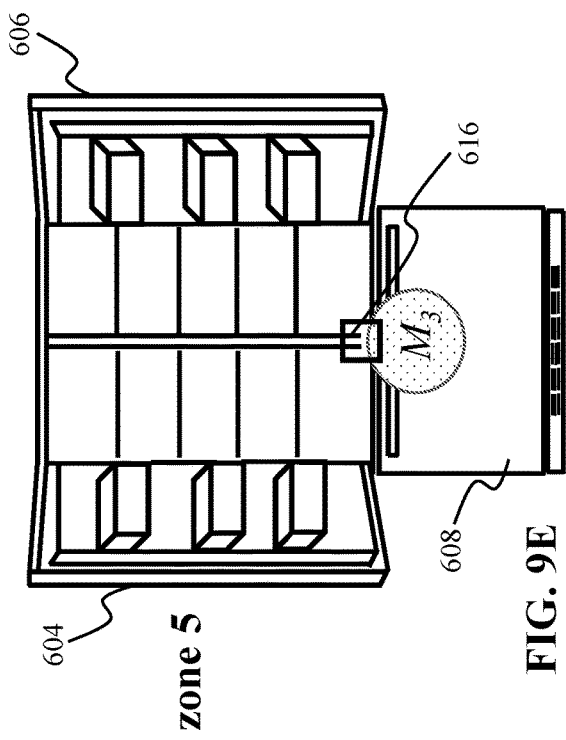
Figure 9G:
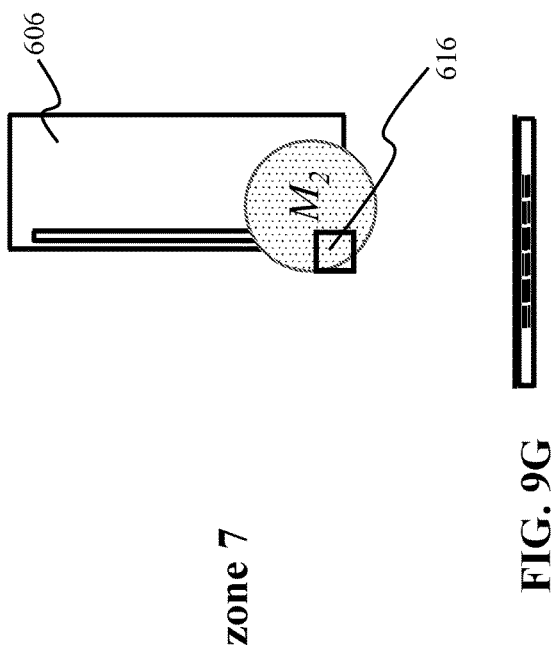

In FIG. 9F, a sixth zone (zone 6) is shown in which the door 606 and the door 608 are opened. Zone 6 consists of the magnetic field for magnet $M_1$, whereas the magnetic field for the $M_2$ magnet (door 606) and the $M_3$ magnet (door 608) are outside the sensing area. The resultant magnetic field detected by the analog sensor 616 is $M_1$. In FIG. 9G, a seventh zone (zone 7) is shown in which the door 604 and the door 608 are opened. Zone 7 consists of the magnetic field for magnet $M_2$, whereas the magnetic field for the magnet $M_1$ (door 604) and the magnet $M_3$ (door 608) are outside the sensing area. The resultant magnetic field detected by the analog sensor 616 is $M_2$. An eighth zone (zone 8), not depicted in the figures, occurs when there is no magnetic field because the magnetic field for the magnet $M_1$ (the door 604), the magnet $M_2$ (the door 606), and the magnet $M_3$ (the door 608) are all outside the sensing area. There is thus no resultant magnetic field detected by the analog sensor 616 in zone 8.

FIGS. 9A-9G and Table 2 thus show that the analog sensor 616 of the analog magnetic sensing system 600 can use a resultant magnetic field that is a sum of one, two, or three magnetic fields to determine which one, two, or three of the refrigerator doors are open. Alternatively, the analog sensor 616 of the analog magnetic sensing system 600 is also able to individually detect the position of each magnet.

In exemplary embodiments, the analog sensor 616 outputs a continuous voltage in response to measuring the vector field of all three magnets. From the output voltage, eight voltage ranges are defined to identify which of the doors of the refrigerator are closed. Thus, in zone 1 (FIG. 9A), the analog sensor 616 the voltage transmitted by the sensor would be between a first range of voltages; in zone 2 (FIG. 9B), the voltage transmitted by the sensor would be between a second range of voltages; and so on.

Figure 10:
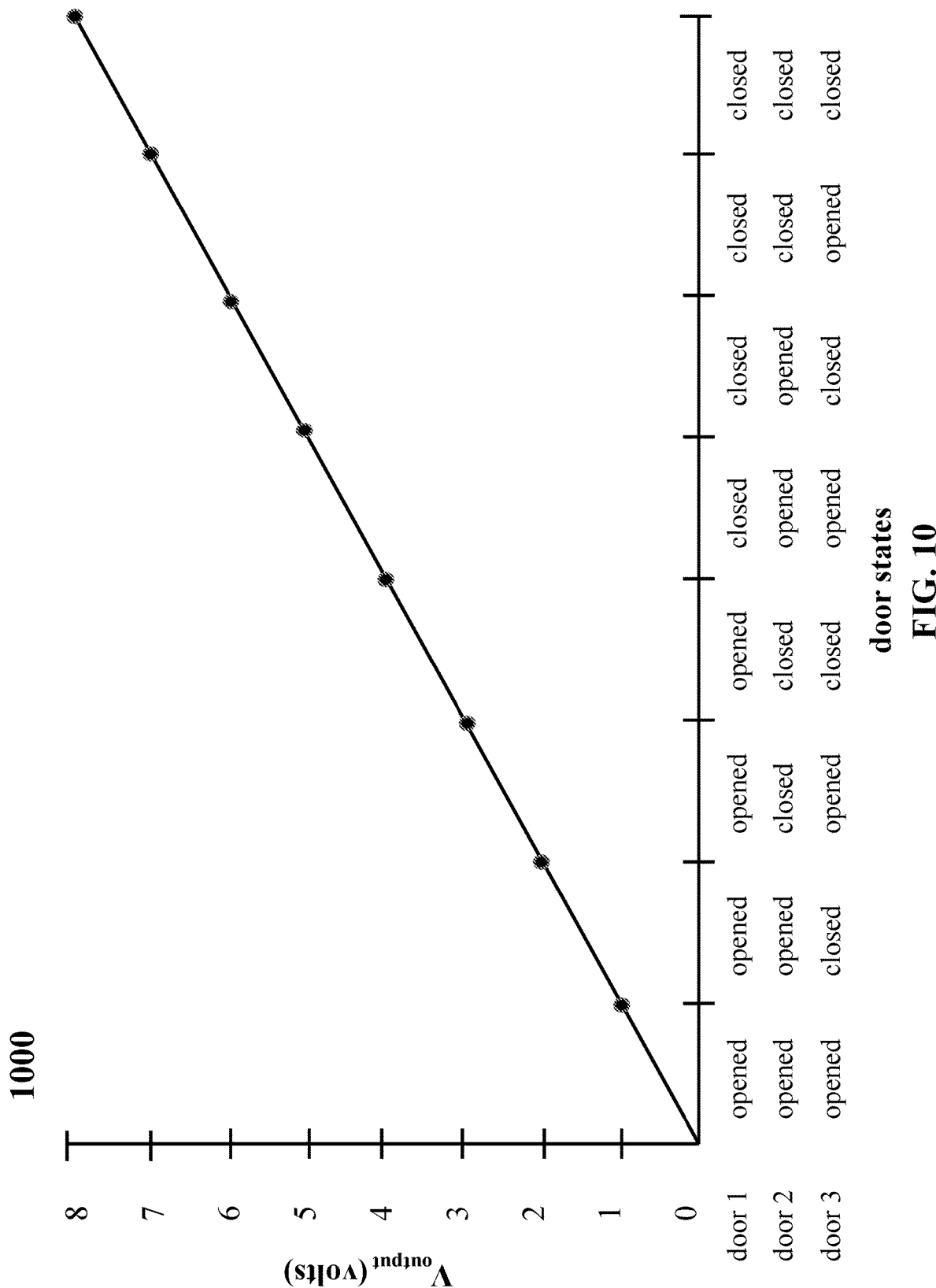
FIG. 10 is a graph illustrating the output supplied by the analog magnetic sensing system of FIGS. 6A-6B, in accordance with exemplary embodiments.

FIG. 10 is a graph 1000 illustrating the output of the sensor based on the vector field of the three magnets, according to exemplary embodiments. The voltage output, $V_{output}$, shown in the y axis of the graph 1000 is based on the opened/closed status of the three doors 604, 606, and 608 of the refrigerator 602. Based on the voltage, a determination is thus made about which doors of the refrigerator are opened. The analog output waveform could be converted into a digital format and transmitted on a data bus. Examples include but are not limited to Single Edge Nibble Transmission (SENT), Peripheral Serial Interface version 5 (PSI5), or Pulse-Width Modulated (PWM) formats.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure refers to certain embodiments, numerous modifications, alterations, and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A magnetic sensing system comprising:
 a sensor disposed within a housing of an appliance, wherein the appliance includes a first moving component, a second moving component, and a third moving component;
 a first magnet disposed in a first orientation adjacent the first moving component, a first position of the first magnet to change in concert with movement of the first moving component;
 a second magnet disposed in a second orientation adjacent the second moving component, a second position of the second magnet to change in concert with movement of the second moving component; and
 a third magnet disposed in a third orientation adjacent the third moving component, a third position of the third magnet to change in concert with movement of the third moving component;
 wherein the sensor detects displacement of the first moving component, the second moving component, or the third moving component;
 wherein the first magnetic field strength is twice the second magnetic field strength, and the second magnetic field strength is twice the third magnetic field strength.

2. The magnetic sensing system of claim 1, wherein the first orientation is along a first axis, the second orientation is along a second axis, and the third orientation is along a third axis.

3. The magnetic sensing system of claim 2, wherein the first axis is orthogonal to the second axis, the second axis is orthogonal to the third axis, and the third axis is orthogonal to the first axis.

4. The magnetic sensing system of claim 2, wherein the first axis is 90°±5° from the second axis, the second axis is 90°±5° from the third axis, and the third axis is 90°±5° from the first axis.

5. The magnetic sensing system of claim 2, wherein the sensor is disposed along a fourth axis, wherein an intersection of the first axis, the second axis, and the third axis is disposed on the fourth axis.

6. The magnetic sensing system of claim 1, wherein the first magnet is a first distance from the sensor, the second magnet is a second distance from the sensor, and the third magnet is a third distance from the sensor.

7. The magnetic sensing system of claim 6, wherein the first distance equals the second distance and the second distance equals the third distance.

8. The magnetic sensing system of claim 6, wherein the first distance, the second distance, and the third distance are selected to achieve binary weighting of the first magnet, the second magnet, and the third magnet.

9. A magnetic sensing system disposed in an appliance, the magnetic sensing system comprising:
 an analog sensor centrally located within a housing of the appliance, wherein the analog sensor is oriented along a first axis;
 a first magnet disposed within a first door of the appliance, the first magnet having a first magnetic field strength, wherein the first magnet is oriented along a second axis in a first position;
 a second magnet disposed within a second door of the appliance, the second magnet having a second magnetic field strength, wherein the second magnet is oriented along a third axis in a second position; and
 a third magnet disposed within a third door of the appliance, the third magnet having a third magnetic field strength, wherein the third magnet is oriented along a fourth axis in a third position;
 wherein the analog sensor detects whether any one of the first door, the second door, and the third door is open;
 wherein the first position, the second position, and the third position are selected so that the first magnet, the second magnet, and the third magnet are binary weighted.

10. The magnetic sensing system of claim 9, wherein the first magnetic field strength is twice the second magnetic field strength and the second magnetic field strength is twice the third magnetic field strength.

11. The magnetic sensing system of claim 9, wherein the second axis is 90°±5° from the third axis and the third axis is 90°±5° from the fourth axis.

* * * * *

UNITED STATES PATENT AND TRADEMARK OFFICE
CERTIFICATE OF CORRECTION

PATENT NO. : 11,892,525 B2
APPLICATION NO. : 17/825450
DATED : February 6, 2024
INVENTOR(S) : Todd Sabotta, Seong-Jae Lee and Stephen E. Knapp It is certified that error appears in the above-identified patent and that said Letters Patent is hereby corrected as shown below:

In the Specification

Column 1, Line 7, delete "divisional" and replace with --provisional--

Signed and Sealed this
Twenty-eighth Day of May, 2024

Katherine Kelly Vidal
*Director of the United States Patent and Trademark Office*